US011177280B1

(12) United States Patent
Rajashekhar et al.

(10) Patent No.: US 11,177,280 B1
(45) Date of Patent: Nov. 16, 2021

(54) THREE-DIMENSIONAL MEMORY DEVICE INCLUDING WRAP AROUND WORD LINES AND METHODS OF FORMING THE SAME

(71) Applicant: SANDISK TECHNOLOGIES LLC, Addison, TX (US)

(72) Inventors: Adarsh Rajashekhar, Santa Clara, CA (US); Rahul Sharangpani, Fremont, CA (US); Raghuveer S. Makala, Campbell, CA (US); Fei Zhou, San Jose, CA (US); Yanli Zhang, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 3 days.

(21) Appl. No.: 16/877,328

(22) Filed: May 18, 2020

(51) Int. Cl.
| H01L 27/11582 | (2017.01) |
| H01L 27/11565 | (2017.01) |
| H01L 27/1157 | (2017.01) |
| H01L 27/11519 | (2017.01) |
| H01L 27/11524 | (2017.01) |
| H01L 27/11556 | (2017.01) |
| H01L 27/11543 | (2017.01) |

(52) U.S. Cl.
CPC .... *H01L 27/11582* (2013.01); *H01L 27/1157* (2013.01); *H01L 27/11519* (2013.01); *H01L 27/11524* (2013.01); *H01L 27/11543* (2013.01); *H01L 27/11556* (2013.01); *H01L 27/11565* (2013.01)

(58) Field of Classification Search
CPC ......... H01L 27/11543; H01L 27/11524; H01L 27/11519; H01L 27/11556; H01L 27/11565; H01L 27/1157; H01L 27/11582
See application file for complete search history.

(56) References Cited

U.S. PATENT DOCUMENTS

| 5,915,167 A | 6/1999 | Leedy |
| 7,646,041 B2 | 1/2010 | Chae et al. |
| 8,349,681 B2 | 1/2013 | Alsmeier et al. |
| (Continued) | | |

OTHER PUBLICATIONS

US 8,898,061 B2, 11/2014, Cath et al. (withdrawn)
(Continued)

*Primary Examiner* — Allison Bernstein
(74) *Attorney, Agent, or Firm* — The Marbury Law Group PLLC

(57) ABSTRACT

A method of forming a three-dimensional memory device includes forming an alternating stack of insulating layers and sacrificial material layers over a substrate, forming a memory opening through the alternating stack, forming lateral recesses at levels of the sacrificial material layers around the memory opening, forming a vertical stack of discrete clam-shaped semiconductor liners in the lateral recesses, replacing the vertical stack of discrete clam-shaped semiconductor liners with a vertical stack of inner clam-shaped metallic liners, forming a vertical stack of discrete charge storage elements on the vertical sack of inner clam-shaped metallic liners, forming a tunneling dielectric layer and a vertical semiconductor channel over the vertical stack of discrete charge storage elements and the vertical stack of inner clam-shaped metallic liners, and replacing each of the sacrificial material layers with an electrically conductive layer.

20 Claims, 27 Drawing Sheets

(56) References Cited

U.S. PATENT DOCUMENTS

| | | |
|---|---|---|
| 8,741,714 B2 | 6/2014 | Lee |
| 8,829,591 B2 | 9/2014 | Alsmeier |
| 8,860,124 B2 | 10/2014 | Lue et al. |
| 8,946,810 B2 | 2/2015 | Alsmeier |
| 9,159,739 B2 | 10/2015 | Makala et al. |
| 9,165,940 B2 | 10/2015 | Chien et al. |
| 9,230,976 B2 | 1/2016 | Alsmeier |
| 9,484,358 B2 | 11/2016 | Alsmeier |
| 9,524,779 B2 * | 12/2016 | Kai ................. G11C 16/0425 |
| 9,576,966 B1 * | 2/2017 | Peri ................. H01L 27/11582 |
| 9,613,977 B2 | 4/2017 | Sharangpani et al. |
| 9,659,955 B1 | 5/2017 | Sharangpani et al. |
| 9,659,956 B1 | 5/2017 | Pachamuthu et al. |
| 9,780,182 B2 | 10/2017 | Peri et al. |
| 9,831,268 B2 | 11/2017 | Alsmeier |
| 9,875,929 B1 | 1/2018 | Shukla et al. |
| 9,984,963 B2 | 5/2018 | Peri et al. |
| 10,115,897 B1 * | 10/2018 | Sato .................. H01L 45/146 |
| 10,128,261 B2 | 11/2018 | Makala et al. |
| 10,283,513 B1 | 5/2019 | Zhou et al. |
| 10,381,376 B1 | 8/2019 | Nishikawa et al. |
| 10,438,964 B2 | 10/2019 | Makal et al. |
| 10,804,282 B2 * | 10/2020 | Baraskar ........... H01L 27/11556 |
| 11,049,807 B2 * | 6/2021 | Li ................... H01L 27/1157 |
| 2003/0011025 A1 | 1/2003 | Tsuji |
| 2004/0145024 A1 | 7/2004 | Chen et al. |
| 2004/0251490 A1 | 12/2004 | Chae et al. |
| 2005/0122780 A1 | 6/2005 | Chen et al. |
| 2005/0128807 A1 | 6/2005 | Chen et al. |
| 2005/0169055 A1 | 8/2005 | Lung |
| 2005/0199913 A1 | 9/2005 | Hofmann et al. |
| 2006/0007727 A1 | 1/2006 | Harrison et al. |
| 2007/0018201 A1 | 1/2007 | Specht et al. |
| 2007/0138541 A1 | 6/2007 | Chae et al. |
| 2007/0206422 A1 | 9/2007 | Roohparvar |
| 2007/0242511 A1 | 10/2007 | Chen et al. |
| 2007/0284650 A1 | 12/2007 | Wilier |
| 2008/0062767 A1 | 3/2008 | Crippa et al. |
| 2008/0149996 A1 | 6/2008 | Mokhlesi |
| 2008/0153226 A1 | 6/2008 | Mokhlesi |
| 2008/0205147 A1 | 8/2008 | Santin et al. |
| 2009/0034331 A1 | 2/2009 | Roohparvar |
| 2009/0175081 A1 | 7/2009 | Kim |
| 2009/0230461 A1 | 9/2009 | Lee |
| 2010/0038698 A1 | 2/2010 | Lee |
| 2010/0176438 A1 | 7/2010 | Lue et al. |
| 2010/0296346 A1 | 11/2010 | Rooparvar |
| 2011/0170352 A1 | 7/2011 | Kim |
| 2012/0001249 A1 | 1/2012 | Msmeier et al. |
| 2013/0270631 A1 | 10/2013 | Kim et al. |
| 2014/0022846 A1 | 1/2014 | Kim |
| 2014/0091381 A1 | 4/2014 | Lee |
| 2014/0097497 A1 | 4/2014 | Hui |
| 2014/0112075 A1 | 4/2014 | Dunga et al. |
| 2014/0247670 A1 | 9/2014 | Dunga et al. |
| 2015/0364207 A1 | 12/2015 | Kim |
| 2016/0148945 A1 | 5/2016 | Sharangpani et al. |
| 2016/0225866 A1 | 8/2016 | Peri et al. |
| 2016/0351497 A1 | 12/2016 | Peri et al. |
| 2016/0379989 A1 | 12/2016 | Sharangpani et al. |
| 2017/0018571 A1 | 1/2017 | Alsmeier |
| 2017/0125436 A1 | 5/2017 | Sharangpani et al. |
| 2017/0229188 A1 | 8/2017 | Kim |
| 2017/0352669 A1 | 12/2017 | Sharangpani et al. |
| 2018/0151746 A1 | 5/2018 | Tu et al. |
| 2018/0374866 A1 | 12/2018 | Makala et al. |
| 2019/0103493 A1 | 4/2019 | Tu et al. |
| 2019/0139973 A1 | 5/2019 | Zhou et al. |
| 2020/0020715 A1 | 1/2020 | Nakamura et al. |
| 2020/0075070 A1 | 3/2020 | Gupta et al. |
| 2021/0159167 A1 * | 5/2021 | Tsutsumi .......... H01L 27/11565 |

OTHER PUBLICATIONS

Notification of Transmittlal of the International Search Report and the Written Opinion of the International Searching Authority for International Patent Application No. PCT/US2020/067502, dated Apr. 21, 2021, 13 pages.

Endoh et al., "Novel Ultra High Density Memory with a Stacked-Surrounding Gate Transistor (S-SGT) Structured Cell," IEDM Proc. (2001) 33-36.

U.S. Appl. No. 16/272,468, filed Feb. 11, 2019, SanDisk Technologies LLC.

U.S. Appl. No. 16/582,262, filed Sep. 25, 2019, SanDisk Technologies LLC.

U.S. Appl. No. 16/695,775, filed Nov. 26, 2019, SanDisk Technologies LLC.

U.S. Appl. No. 16/801,456, filed Feb. 26, 2020, SanDisk Technologies LLC.

* cited by examiner

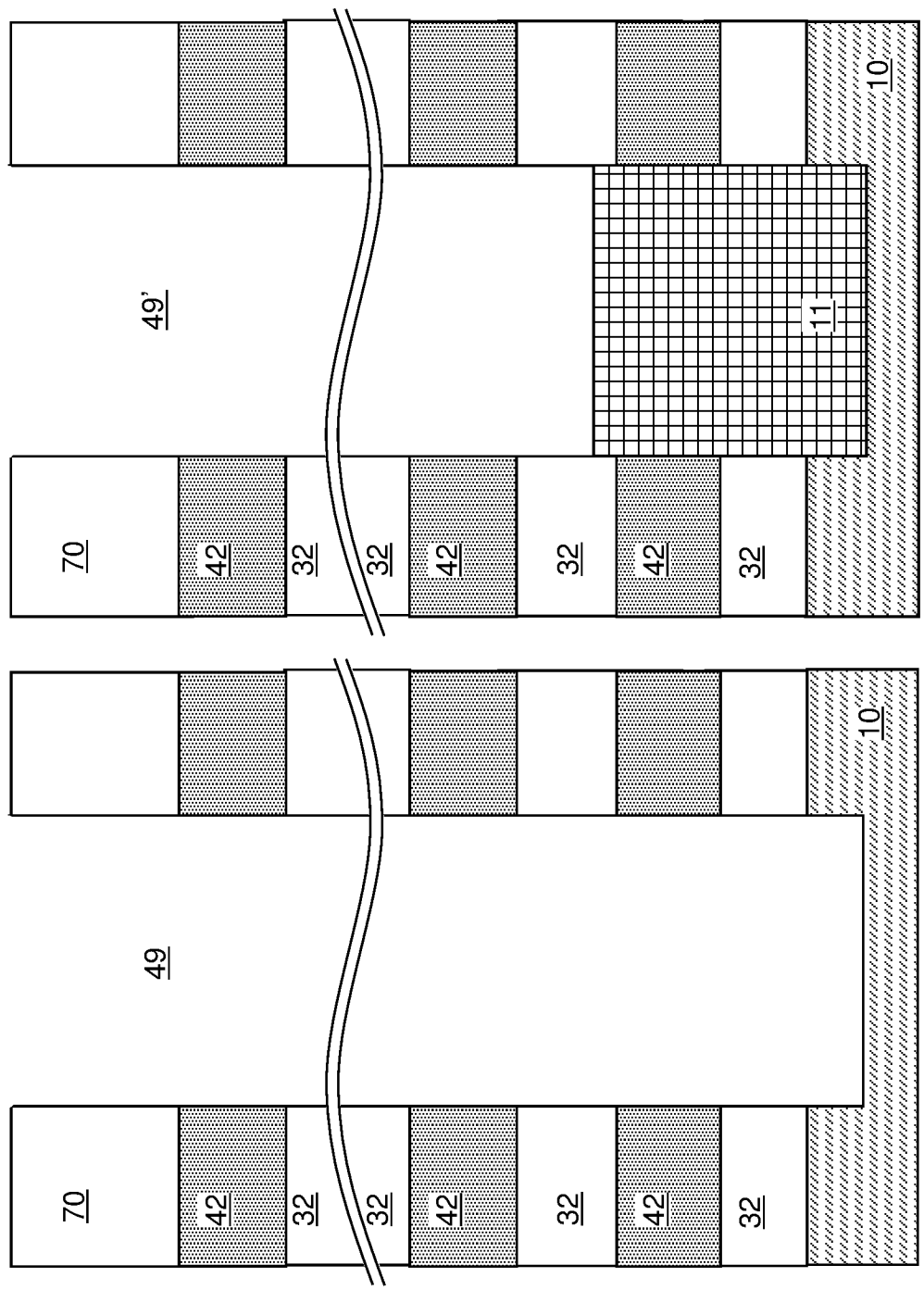

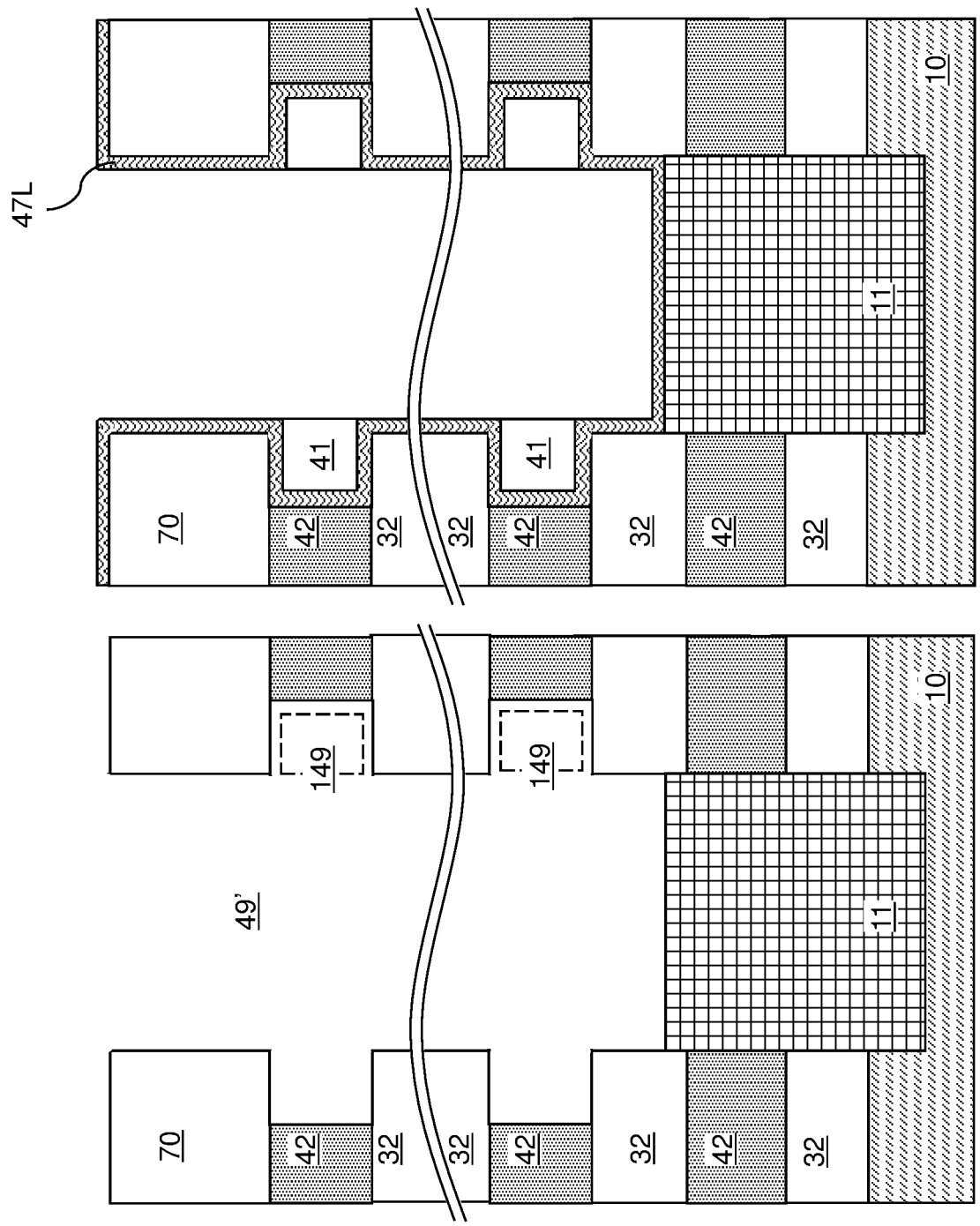

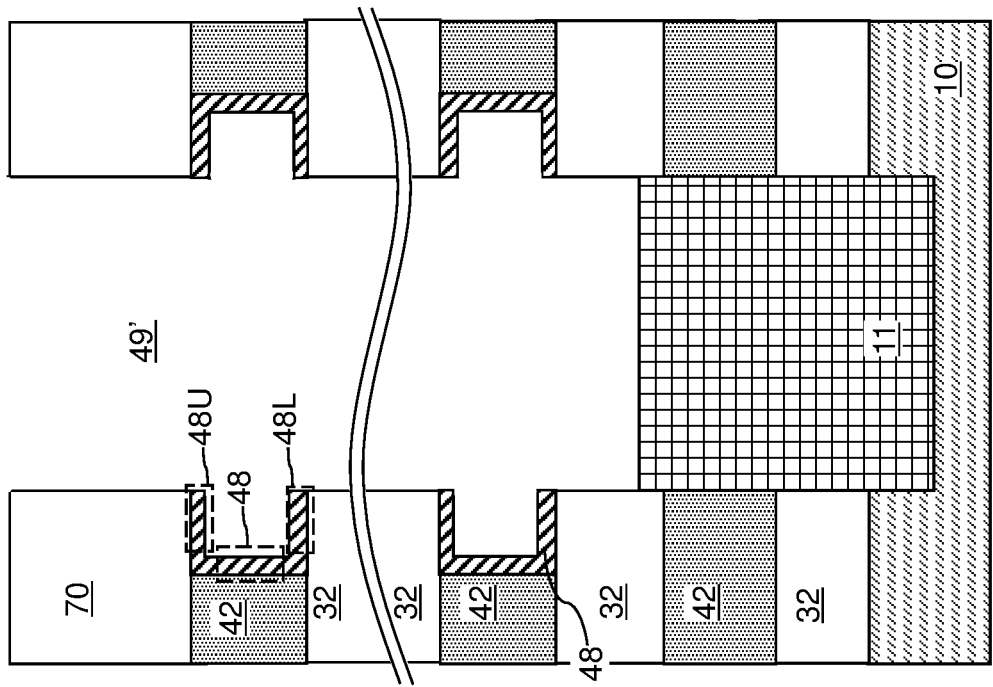
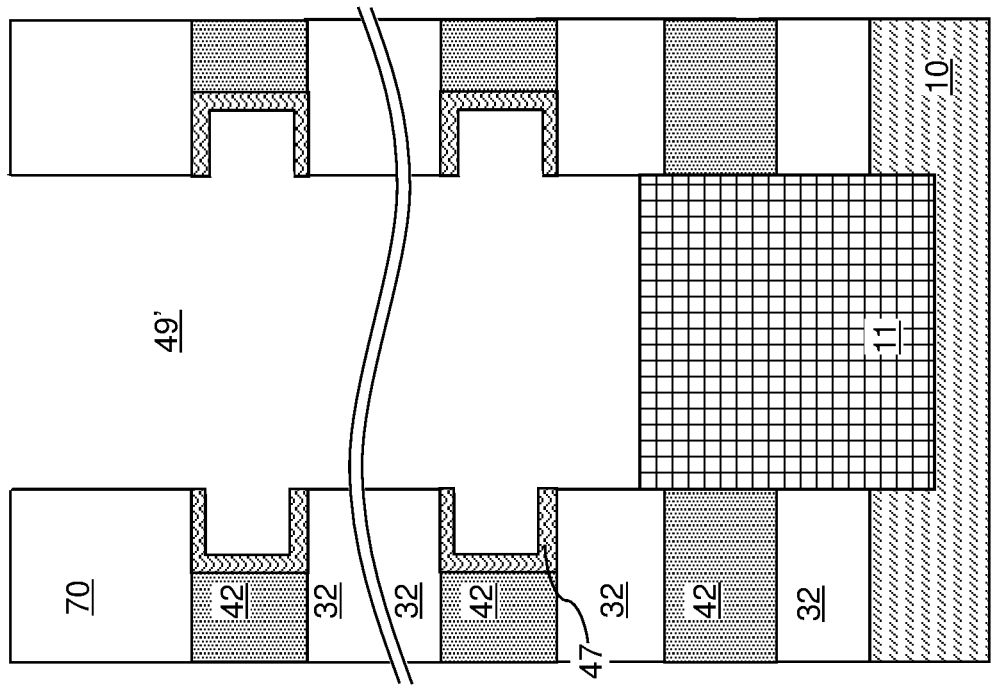

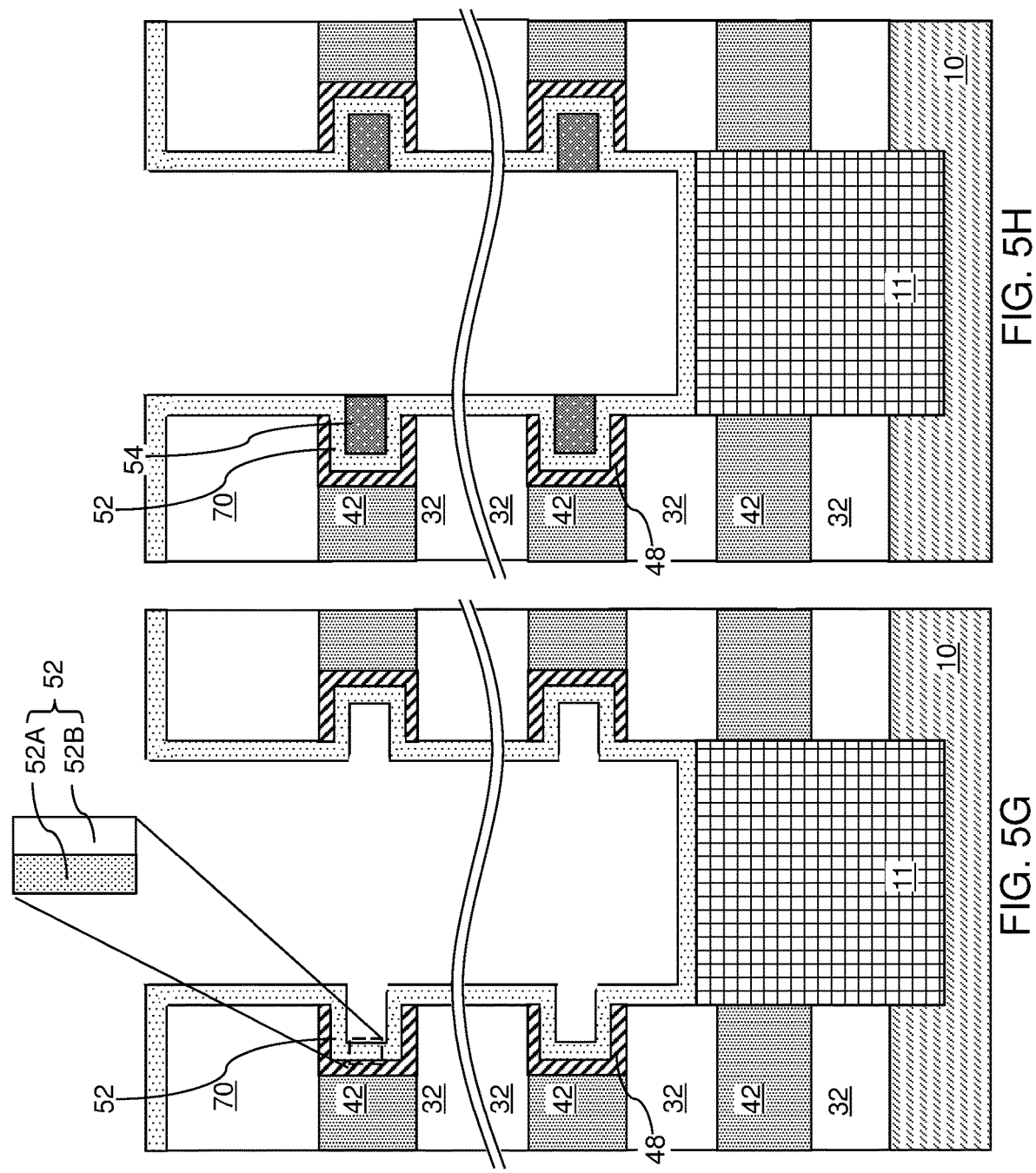

US 11,177,280 B1

THREE-DIMENSIONAL MEMORY DEVICE INCLUDING WRAP AROUND WORD LINES AND METHODS OF FORMING THE SAME

FIELD

The present disclosure relates generally to the field of semiconductor devices, and particularly to a three-dimensional memory device containing wrap around word lines and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate; and memory stack structures extending through the alternating stack, wherein each of the memory stack structures comprises a blocking dielectric layer, a vertical stack of discrete charge storage elements located at levels of the electrically conductive layers, a tunneling dielectric layer contacting the blocking dielectric layer and the vertical stack of discrete charge storage elements, and a vertical semiconductor channel; and inner clam-shaped metallic liners in contact with the respective discrete charge storage elements. Each electrically conductive layer within a subset of electrically conductive layers located at levels of the vertical stack of discrete charge storage elements comprises a respective outer clam-shaped metallic liner contacting and laterally surrounding the respective inner clam-shaped metallic liner, and a respective metallic fill material portion embedded within the respective outer clam-shaped metallic liner.

According to another aspect of the present disclosure, a method of forming a three-dimensional memory device includes forming an alternating stack of insulating layers and sacrificial material layers over a substrate, forming a memory opening through the alternating stack, forming lateral recesses at levels of the sacrificial material layers around the memory opening, forming a vertical stack of discrete clam-shaped semiconductor liners in the lateral recesses, replacing the vertical stack of discrete clam-shaped semiconductor liners with a vertical stack of inner clam-shaped metallic liners, forming a vertical stack of discrete charge storage elements on the vertical sack of inner clam-shaped metallic liners, forming a tunneling dielectric layer and a vertical semiconductor channel over the vertical stack of discrete charge storage elements and the vertical stack of inner clam-shaped metallic liners, and replacing each of the sacrificial material layers with an electrically conductive layer.

DETAILED DESCRIPTION

Figure 1:
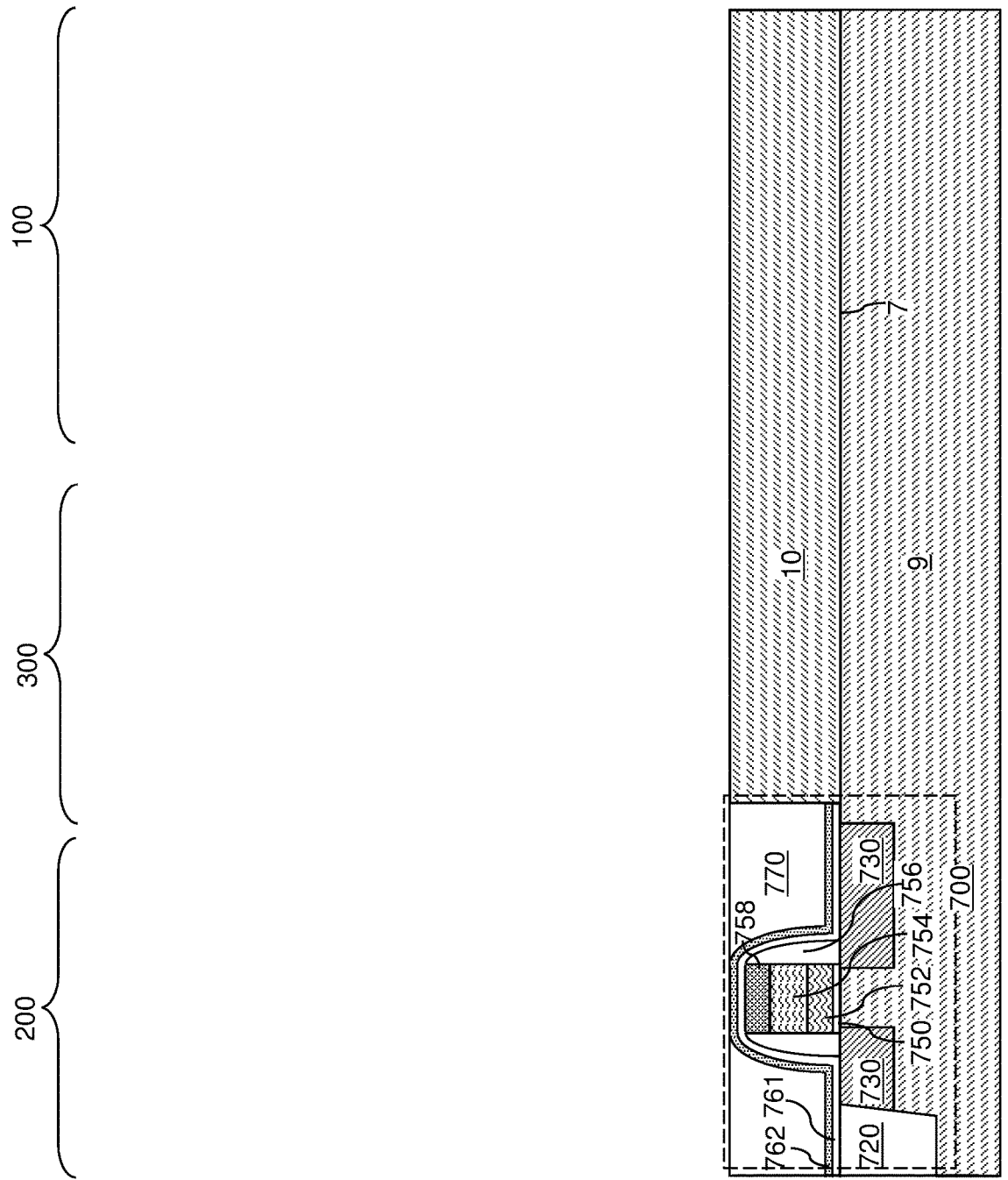
FIG. 1 is a schematic vertical cross-sectional view of an exemplary structure after formation of at least one peripheral device and a semiconductor material layer according to an embodiment of the present disclosure.

As discussed above, the present disclosure is directed to a three-dimensional memory device employing wrap around word lines having enhanced capacitive coupling with the discrete charge storage regions and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers can be provided between the memory array region 100 and the peripheral device region 200.

Figure 2:
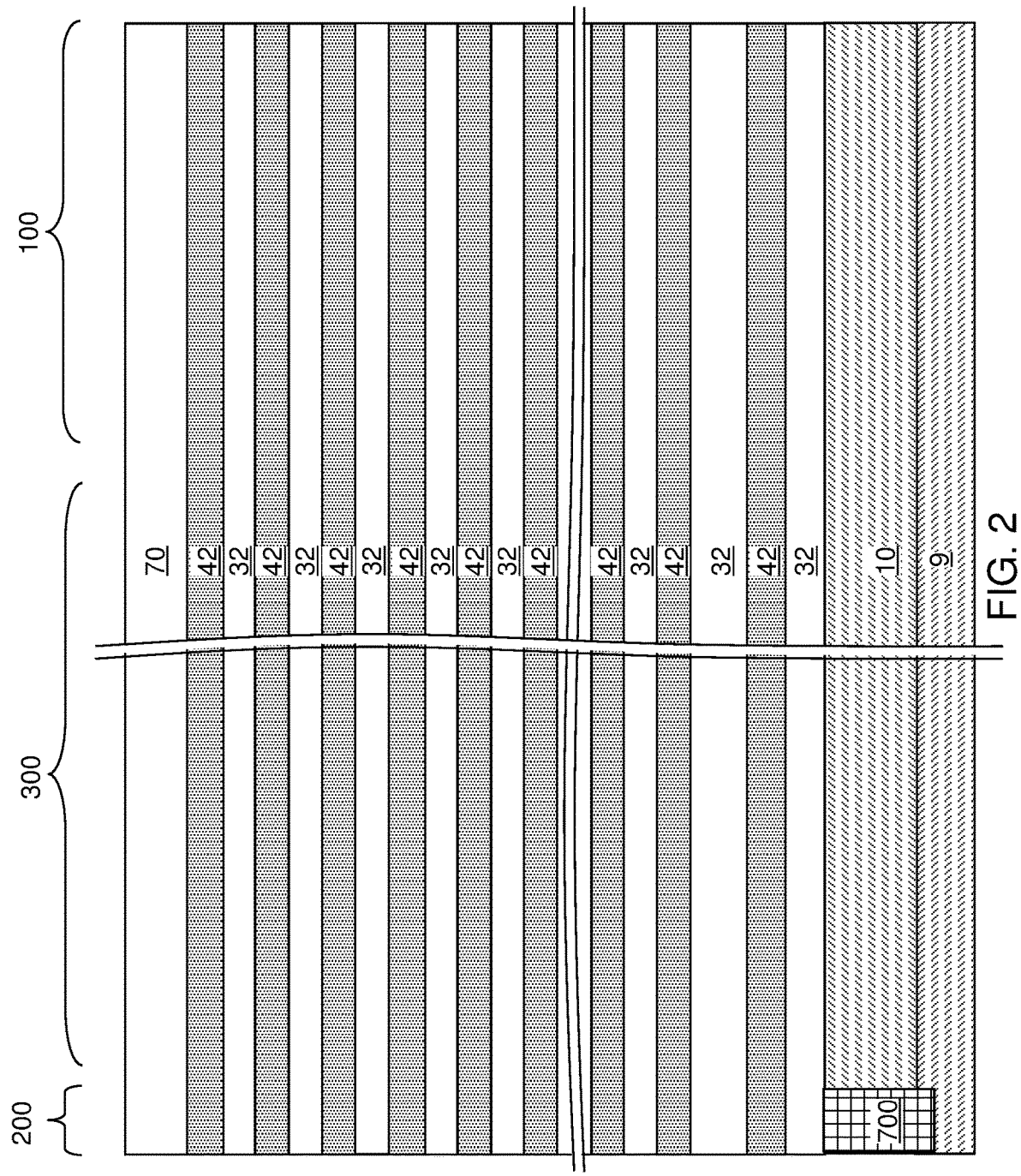
FIG. 2 is a schematic vertical cross-sectional view of the exemplary structure after formation of an alternating stack of insulating layers and sacrificial material layers according to an embodiment of the present disclosure.

In one alternative embodiment, the at least one semiconductor device 700 for the peripheral circuitry can be formed in the memory array region 100 under the alternating stack that will be formed in a subsequent step shown in FIG. 2. Thus, the least one semiconductor device 700 may comprise a CMOS device located under the memory array. In another alternative embodiment, the at least one semiconductor device 700 may be formed on a separate substrate which is subsequently bonded to the memory array. Thus, the least one semiconductor device 700 may comprise a CMOS device bonded to the memory array.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
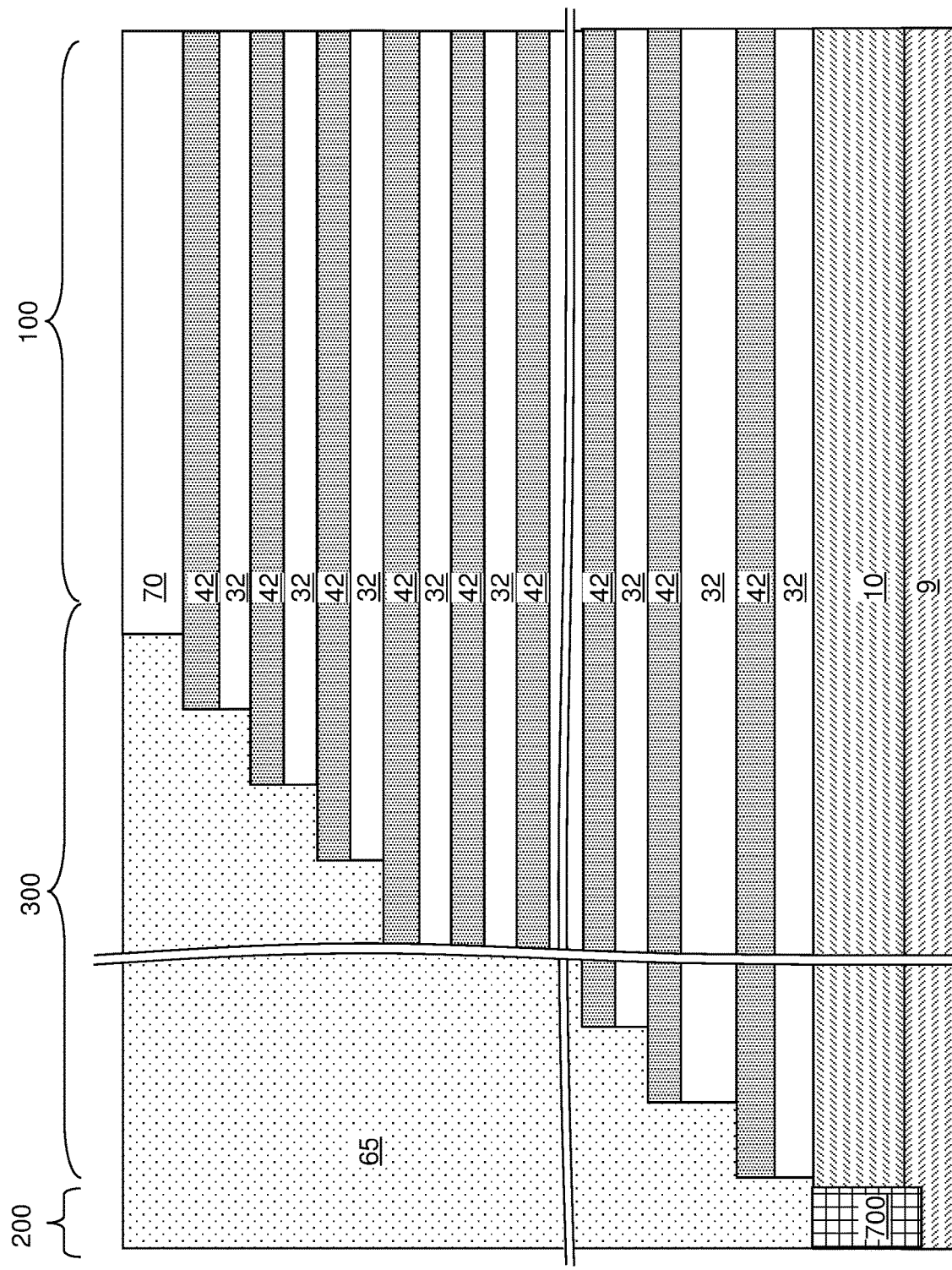
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
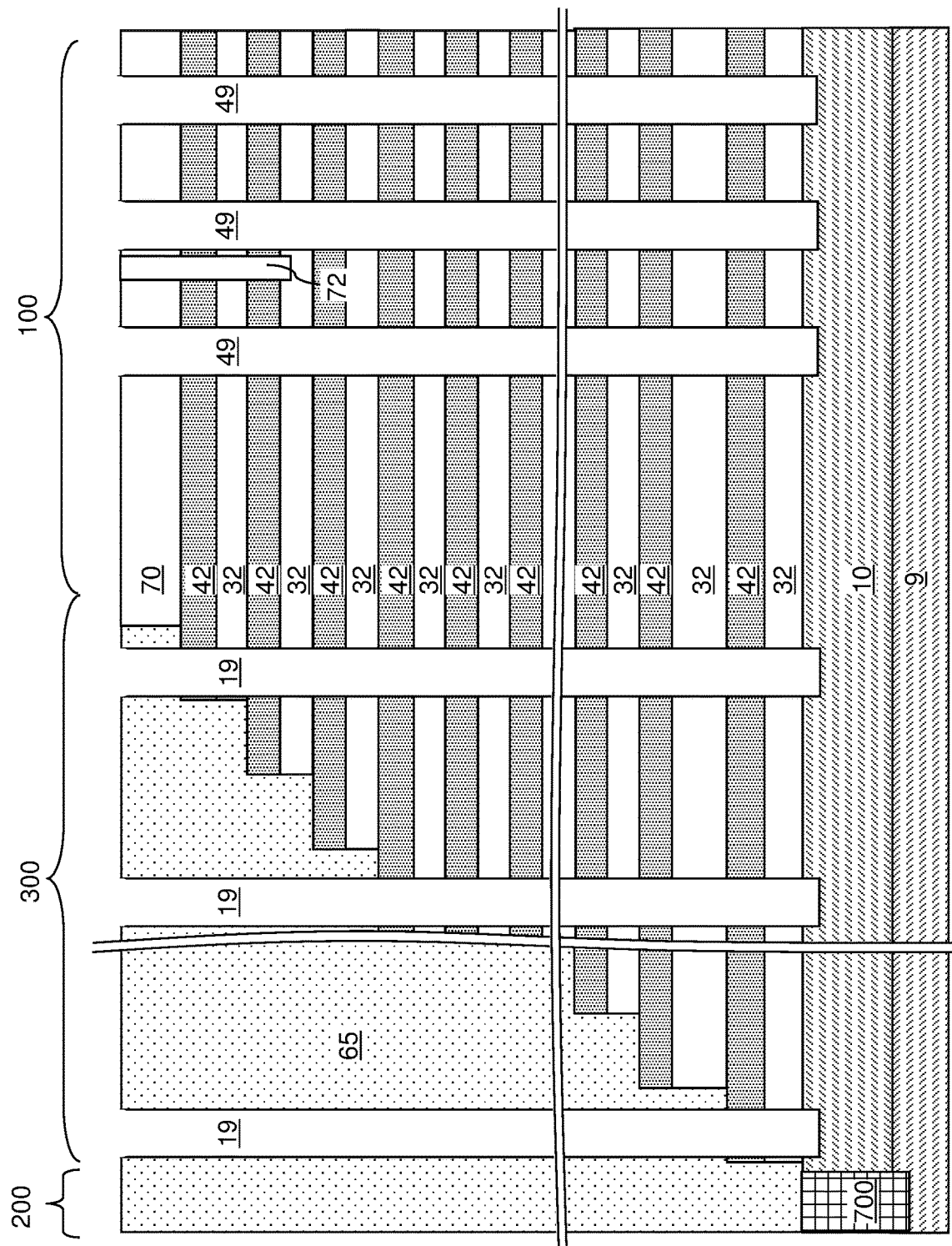
FIG. 4A is a schematic vertical cross-sectional view of the exemplary structure after formation of memory openings and support openings according to an embodiment of the present disclosure.
Figure 4B:
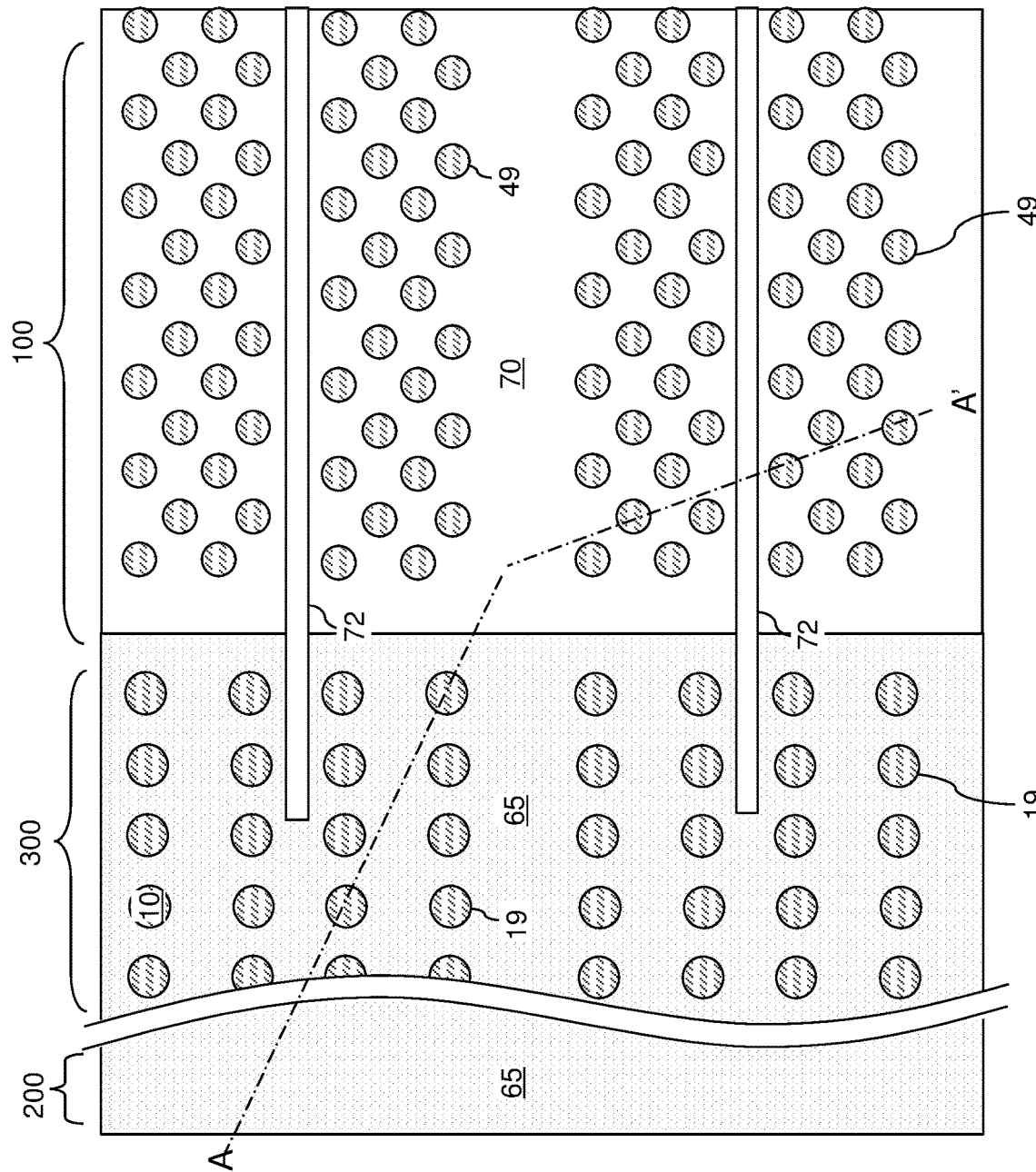
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

Figures 5I, 5J:
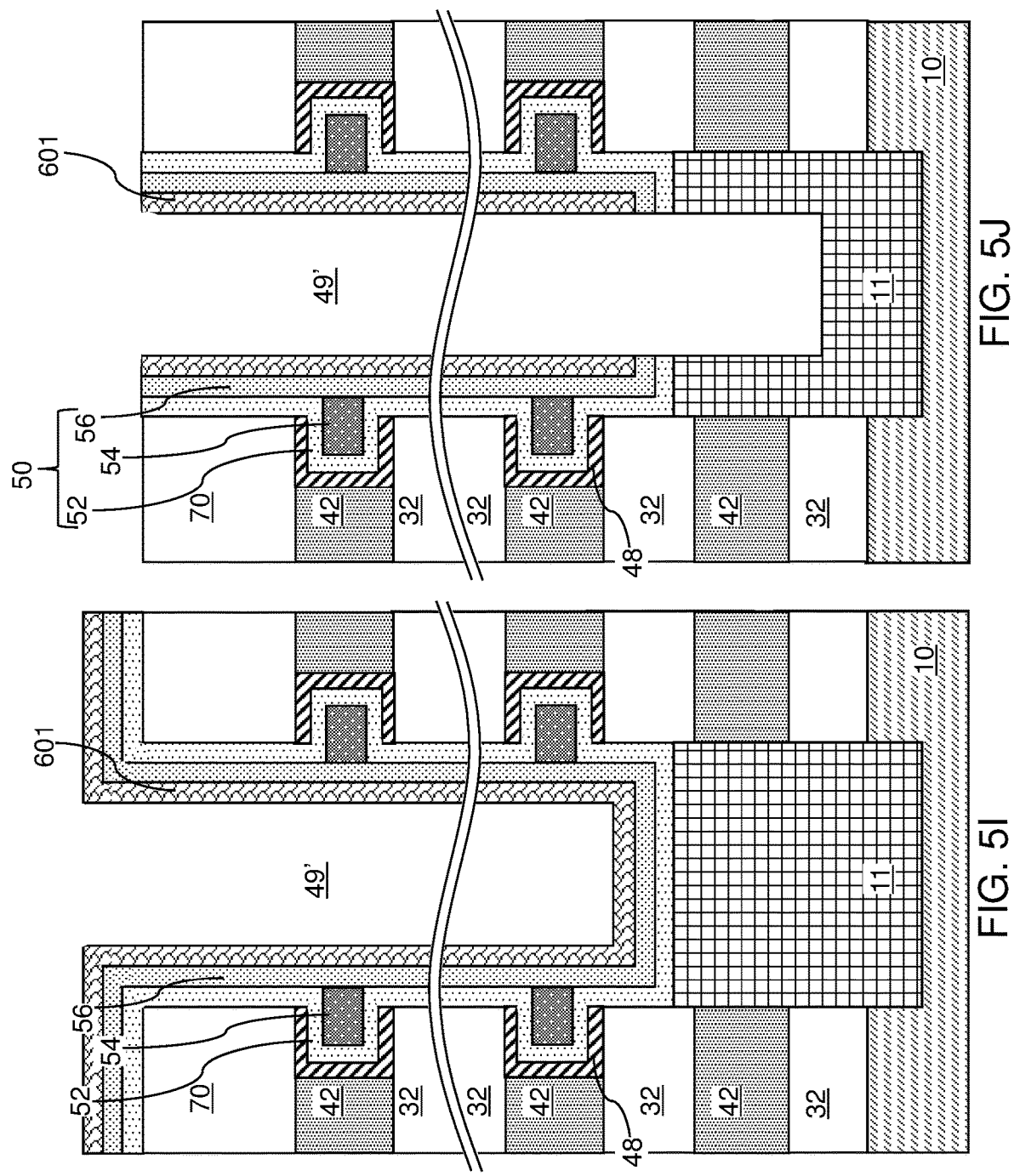
FIGS. 5A-5N are sequential schematic vertical cross-sectional views of a memory opening within the exemplary structure during formation of a memory stack structure, an optional dielectric core, and a drain region therein according to an embodiment of the present disclosure.
Figures 5K, 5L:
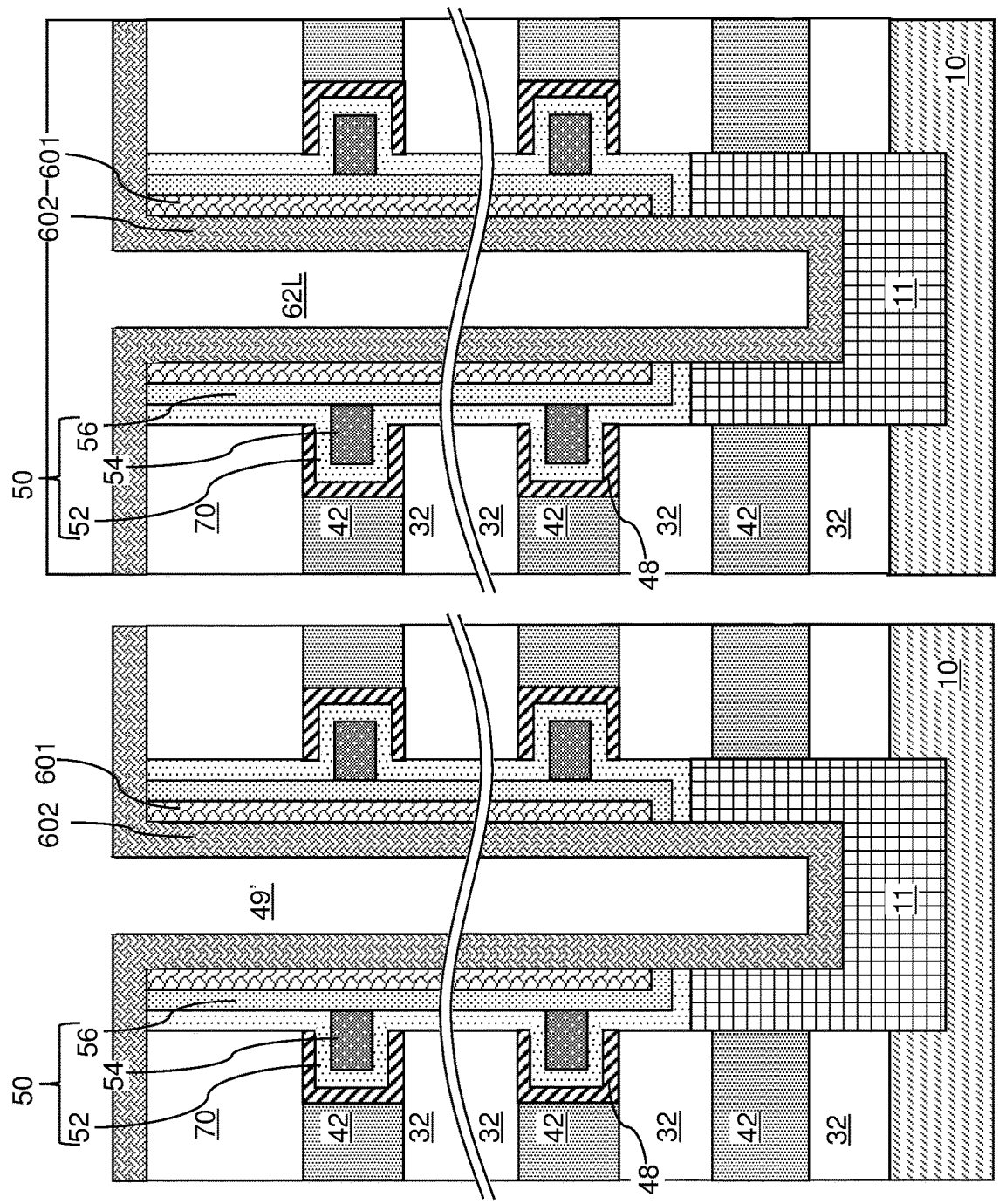
Figure 5N:
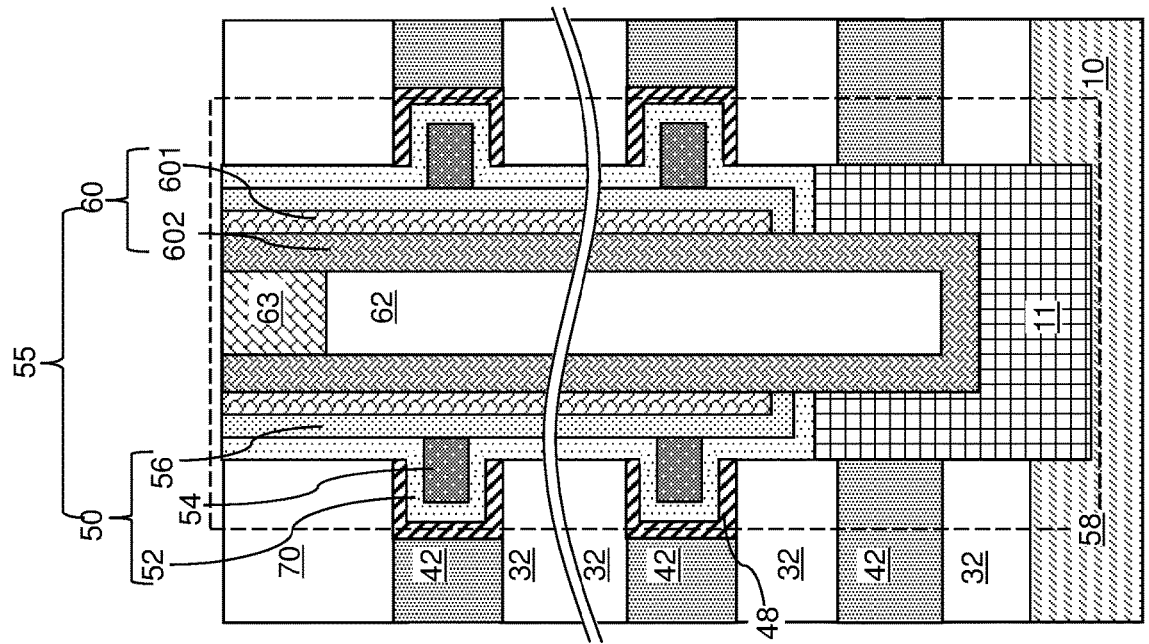

FIGS. 5A-5N illustrate structural changes in a memory opening 49, which is one of the memory openings 49 in the exemplary structure of FIGS. 4A and 4B. The same structural change occurs simultaneously in each of the other memory openings 49 and in each of the support openings 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the top surface of each pedestal channel portion 11 can be formed above a horizontal plane including the top surface of a bottommost sacrificial material layer 42. In this case, a source select gate electrode can be subsequently formed by replacing the bottommost sacrificial material layer 42 with a conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type. An unfilled portion of each memory opening 49 comprises a memory cavity 49'.

Referring to FIG. 5C, an isotropic etch process that etches the material of the sacrificial material layers 42 selective to the material of the insulating layers 32 can be performed to form lateral recesses 149 around each memory opening 49. The lateral recesses 149 are formed at each level of the sacrificial material layers 42 located above the horizontal plane including the top surface of the pedestal channel portion 11 within each memory opening 49. For example, if the insulating layers 32 include silicon oxide and if the sacrificial material layers 42 include silicon nitride, a wet etch employing hot phosphoric acid may be performed to laterally recess the sacrificial material layers 42 isotropically. Each memory cavity 49' can be laterally expanded by the volumes of a vertical stack of lateral recesses 149. Each lateral recess 149 can have a respective annular volume that is connected to the volume of the memory cavity 49' as provided at the processing steps of FIG. 5B. The lateral recess distance of each lateral recess 149 can be in a range from 10 nm to 80 nm, such as from 20 nm to 40 nm, although lesser and greater lateral recess distances can also be employed. The lateral recess distance is the lateral distance between a recessed sidewall of a sacrificial material layer relative to a most proximal sidewall of the insulating layers 32 around a memory opening 49.

Referring to FIG. 5D, a semiconductor material layer 47L can be deposited on the surfaces of the lateral recesses 149 and on sidewalls of the insulating layers 32 around each memory opening. The semiconductor material layer 47L includes a semiconductor material that can be employed to nucleate a metal from a precursor gas for metal deposition. In one embodiment, the semiconductor material layer 47L can include a semiconductor material that can volatilize after nucleation of the metal from the precursor gas for metal deposition. For example, the semiconductor material layer 47L can include and/or can consist essentially of silicon that can be employed to nucleate tungsten from tungsten hexafluoride ($WF_6$) and form a volatile compound (such as $SiF_4$) after nucleation of tungsten from tungsten hexafluoride. Generally, the semiconductor material layer 47L can include silicon, germanium, or a silicon-germanium alloy, and the precursor gas may include any metal precursor gas that can deposit metal and form a volatile compound upon combination with the semiconductor material of the semiconductor material layer 47L. The semiconductor material layer 47L can be deposited by a conformal deposition process such as a low pressure chemical vapor deposition (LPCVD) process. The thickness of the semiconductor material layer 47L can be in a range from 1 nm to 8 nm, such as from 2 nm to 4 nm, although lesser and greater thicknesses can also be employed.

An insulating fill material such as undoped silicate glass, a doped silicate glass, silicon nitride, or silicon carbide nitride can be deposited in remaining volumes of the lateral recesses by a conformal deposition process. In one embodiment, the insulating fill material may include a material that can be removed selective to the material of the insulating layers 32 and the insulating cap layer 70. For example, the insulating layers 32 and the insulating cap layer 70 may include undoped silicate glass, and the insulating fill material may include borosilicate glass or organosilicate glass that has a higher etch rate in dilute hydrofluoric acid than undoped silicate glass. Alternatively, the insulating fill material may include amorphous carbon. An anisotropic etch process can be performed to remove portions of the insulating fill material located outside the volumes of the lateral recesses 149. Remaining portions of the insulating fill material in the lateral recesses include annular insulating material portions 41. A vertical stack of annular insulating material portions 41 can be formed in remaining volumes of the lateral recesses after formation of the semiconductor material layer 47L.

Referring to FIG. 5E, an etch process can be performed to remove portions of the semiconductor material layer 47L that are not masked by the vertical stack of annular insulating material portions 41. The etch process may include a selective isotropic etch process (such as a wet etch process) or an anisotropic etch process (such as a reactive ion etch process). In case an isotropic etch process is employed, the isotropic etch process may include a wet etch process using hot trimethyl-2 hydroxyethyl ammonium hydroxide ("hot TMY") or tetramethyl ammonium hydroxide (TMAH). The selective etch process can be selective to the material of the insulating layers 32 and the insulating cap layer 70. The selective etch process removes portions of the semiconductor material layer 47L that are located on the sidewalls of the insulating layers 32, on the sidewalls of the insulating cap layer 70, or over the top surface of the insulating cap layer 70. Generally, portions of the semiconductor material layer 47L that are not masked by the vertical stack of annular insulating material portions 41 can be removed. Remaining portions of the semiconductor material layer 47L comprise a vertical stack of discrete clam-shaped semiconductor liners 47.

The vertical stack of discrete clam-shaped semiconductor liners 47 is formed within the lateral recesses 149 of each memory opening 49. As used herein, a "clam-shaped" element refers to an element having a vertically-extending portion, an upper horizontally-extending portion adjoined to a top end of the vertically-extending portion and having a greater lateral extent than the lateral thickness of the vertically-extending portion, and a lower horizontally-extending portion adjoined to a bottom end of the vertically-extending portion and having a greater lateral extent than the lateral thickness of the vertically-extending portion. Thus, each discrete clam-shaped semiconductor liner 47 can have the vertically-extending portion, the upper horizontally-extending portion, and the lower horizontally-extending portion. In one embodiment, each discrete clam-shaped semiconductor liner 47 can have a substantially uniform thickness throughout due to the conformal deposition process employed to deposit the semiconductor material layer 47L. The vertical stack of annular insulating material portions 41 can be subsequently removed by a selective isotropic etch process or ashing selective to the materials of the insulating layers 32 and the insulating cap layer 70. For example, if the insulating layers 32 and the insulating cap layer 70 includes undoped silicate glass and if the vertical stack of annular insulating material portions 41 includes borosilicate glass or organosilicate glass, a wet etch process employing dilute hydrofluoric acid may be employed. If the insulating fill material of the vertical stack of annular insulating material portions 41 includes amorphous carbon, the vertical stack of annular insulating material portions 41 may be removed by ashing. The vertical stack of discrete clam-shaped semiconductor liners 47 is formed in peripheral portions of the lateral recesses 149.

Referring to FIG. 5F, the vertical stack of discrete clam-shaped semiconductor liners 47 may be replaced with a vertical stack of inner clam-shaped metallic liners 48. For example, a precursor gas for a metallic material of the inner clam-shaped metallic liners 48 can be applied to the exemplary structure after the exemplary structure is disposed in a process chamber, such as a chemical vapor deposition process chamber. The precursor gas can selectively nucleate on the semiconductor material of the discrete clam-shaped semiconductor liners 47 without nucleating on surfaces of the insulating layers 32 or on the surfaces of the insulating cap layer 70. The precursor gas deposits the metallic material of the inner clam-shaped metallic liners 48 and volatilizes the semiconductor material of the discrete clam-shaped semiconductor liners 47, thereby forming the vertical stack of inner clam-shaped metallic liners 48. For example, the precursor gas may include tungsten hexafluoride ($WF_6$), and the metallic material of the inner clam-shaped metallic liners 48 can include, and/or can consist essentially of, tungsten. The tungsten may contain a small amount of silicon as an alloying element.

Each inner clam-shaped metallic liner 48 can have a vertically-extending portion, an upper horizontally-extending portion, and a lower horizontally-extending portion. The horizontally-extending portions extend inward from the vertically-extending portion toward the central axis of the memory opening 49. In one embodiment, each inner clam-shaped metallic liner 48 can have a uniform thickness throughout. The thickness of each inner clam-shaped metallic liner 48 can be in a range from 1 nm to 12 nm, such as from 2 nm to 6 nm, although lesser and greater thicknesses can also be employed. The vertical stack of inner clam-shaped metallic liners 48 can be formed at a periphery of each of the lateral recesses 149. Each of the lateral recesses 149 comprises a respective void after formation of the vertical stack of inner clam-shaped metallic liners 48. An optional anisotropic etch process may be performed to remove any metallic material that is deposited on the top surface of the pedestal channel portion 11.

Generally, the vertical stack of inner clam-shaped metallic liners 48 may be formed in the vertical stack of lateral recesses by performing the processing steps of FIGS. 5D-5F with any metallic precursor gas that enables replacement of the vertical stack of discrete clam-shaped semiconductor liners 47 with the vertical stack of inner clam-shaped metallic liners 48. Alternatively, a metal layer can be conformally deposited in lieu of depositing the semiconductor material layer 47L, and can be patterned, for example, by forming a vertical stack of annular insulating material portions 41 and by performing an etch process that divides the metal layer into a vertical stack of inner clam-shaped metallic liners 48. The vertical stack of annular insulating material portions 41 can be subsequently removed selective to the material of the insulating layers 32 and the insulating cap layer 70.

Generally, the vertical stack of inner clam-shaped metallic liners 48 comprises, and/or consists essentially of, a first metallic material. The first metallic material can include, and/or can consist essentially of, a first elemental metal. In one embodiment, the first elemental metal may be selected from tungsten, molybdenum, cobalt, ruthenium, titanium, or tantalum. In one embodiment, each inner clam-shaped metallic liner 48 comprises a tubular portion (i.e., the vertically-extending portion) 48T including an outer sidewall that contacts a cylindrical sidewall of a respective sacrificial material layer 42, an upper annular portion (i.e., the upper horizontally-extending portion) 48U having an outer periphery that is adjoined to an upper periphery of an outer sidewall of the tubular portion, and a lower annular portion (i.e., the lower horizontally-extending portion) 48L having an outer periphery that is adjoined to a lower periphery of the outer sidewall of the tubular portion.

Referring to FIG. 5G, a blocking dielectric layer 52 can be formed on the physically exposed surfaces of the vertical stack of inner clam-shaped metallic liners 48, sidewalls of the insulating layers 32, and on the physically exposed surfaces of the insulating cap layer 70. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($La_2O_3$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof.

In one embodiment, the blocking dielectric layer 52 can include a layer stack of a dielectric metal oxide blocking dielectric layer 52A (such as an aluminum oxide layer) and a silicon oxide blocking dielectric layer 52B that is deposited on the dielectric metal oxide blocking dielectric layer 52A. Each of the dielectric metal oxide blocking dielectric layer 52A and the silicon oxide blocking dielectric layer 52B continuously vertically extends through each sacrificial material layer 42 and the insulating layer 32 that overlies the horizontal plane including the top surface of the pedestal channel portion 11. The thickness of the blocking dielectric layer 52 can be in a range from 1.5 nm to 20 nm, such as from 3 nm to 10 nm, although lesser and greater thicknesses can also be employed. The blocking dielectric layer 52 has a laterally-undulating vertical cross-sectional profile, and includes laterally-protruding portions at each level of the vertical stack of inner clam-shaped metallic liners 48, i.e., at each level of the sacrificial material layers 42 located above the horizontal plane including the top surface of the pedestal channel portion 11. The blocking dielectric layer 52 is in contact with cylindrical surfaces of the insulating layers 32 around each memory opening 49.

In one embodiment, the upper annular portion 48U of each inner clam-shaped metallic liner 48 has an annular bottom surface that contacts an upper annular surface of a laterally protruding portion of the blocking dielectric layer 52, and the lower annular portion 48L of each inner clam-shaped metallic liner 48 has an annular top surface that contacts a lower annular surface of the laterally protruding portion of the blocking dielectric layer 52. Each inner clam-shaped metallic liner 48 can be is in contact with a first portion of a horizontal surface of a respective one of the insulating layers 32. A second portion of the horizontal surface of the respective one of the insulating layers 32 can be in contact with a horizontal surface of a sacrificial material layer 42. Voids are present in the lateral recesses 149 after formation of the blocking dielectric layer 52.

Referring to FIG. 5H, a charge storage material layer can be conformally deposited in the voids in the lateral recesses 149. Portions of the charge storage material layer that are not masked by the blocking dielectric layer 52 can be anisotropically etched outside the volumes of the lateral recesses 149. Remaining portions of the charge storage material layer comprise a vertical stack of discrete charge storage elements 54. Each discrete charge storage element 54 can have an annular configuration. In one embodiment, each discrete charge storage element 54 can include an inner cylindrical sidewall, an outer cylindrical sidewall that contacts the blocking dielectric layer 52.

In one embodiment, the discrete charge storage elements 54 can include a charge trapping material. The charge trapping material can include a dielectric charge trapping material, which can be, for example, silicon nitride. Alternatively, the discrete charge storage elements 54 can include floating gates comprising patterned discrete portions of a conductive material. The conductive material lay include doped polysilicon or a metallic material that is patterned into multiple electrically isolated portions (i.e., floating gates). The vertical stack of discrete charge storage elements 54 can be formed over the blocking dielectric layer 52 and the vertical sack of inner clam-shaped metallic liners 48. The inner sidewall of the blocking dielectric layer 54 and inner cylindrical sidewalls of the inner clam-shaped metallic liners 48 may be vertically coincident.

Referring to FIG. 5I, a tunneling dielectric layer 56, and an optional first semiconductor channel layer 601 can be sequentially deposited over the vertical stack of discrete charge storage elements 54 and the vertical stack of inner clam-shaped metallic liners 48.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material portions (48, 52, 54, 56, 601).

In one embodiment, all surfaces of the vertical stack of discrete charge storage elements 54 can be in contact with a respective surface of the blocking dielectric layer 52 or the tunneling dielectric layer 56. The blocking dielectric layer 52 can have a laterally-undulating vertical cross-sectional profile, and can includes laterally-protruding portions at each level of the vertical stack of discrete charge storage elements 54, i.e., at each level of a subset of the sacrificial material layers 42 located over the horizontal plane including the top surface of the pedestal channel portion 11. In one embodiment, the tunneling dielectric layer 56 can have a straight vertical sectional profile, and can comprise a straight outer sidewall that contacts an inner sidewall of each of the discrete charge storage elements 54.

Referring to FIG. 5J, the optional first semiconductor channel layer 601, the tunneling dielectric layer 56, and the blocking dielectric layer 52 are sequentially anisotropically etched employing at least one anisotropic etch process. The portions of the first semiconductor channel layer 601, the tunneling dielectric layer 56, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, and the blocking dielectric layer 52 at a bottom of each memory cavity 49' can be removed to form openings in remaining portions thereof. Each of the first semiconductor channel layer 601, the tunneling dielectric layer 56, and the blocking dielectric layer 52 can be etched by a respective anisotropic etch process employing a respective etch chemistry, which may, or may not, be the same for the various material layers. Each remaining portion of the first semiconductor channel layer 601 can have a tubular configuration.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located inside the vertical stack of discrete charge storage elements 54. A contiguous set of a blocking dielectric layer 52, a vertical stack of discrete charge storage elements 54, and a tunneling dielectric layer 56 in a memory opening 49 constitutes a memory film 50, which includes a plurality of charge storage regions (comprising the discrete charge storage elements 54) that are insulated from surrounding materials by the blocking dielectric layer 52 and the tunneling dielectric layer 56. In one embodiment, the first semiconductor channel layer 601, the tunneling dielectric layer 56, and the blocking dielectric layer 52 can have vertically coincident sidewalls.

Referring to FIG. 5K, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5L, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 5M:
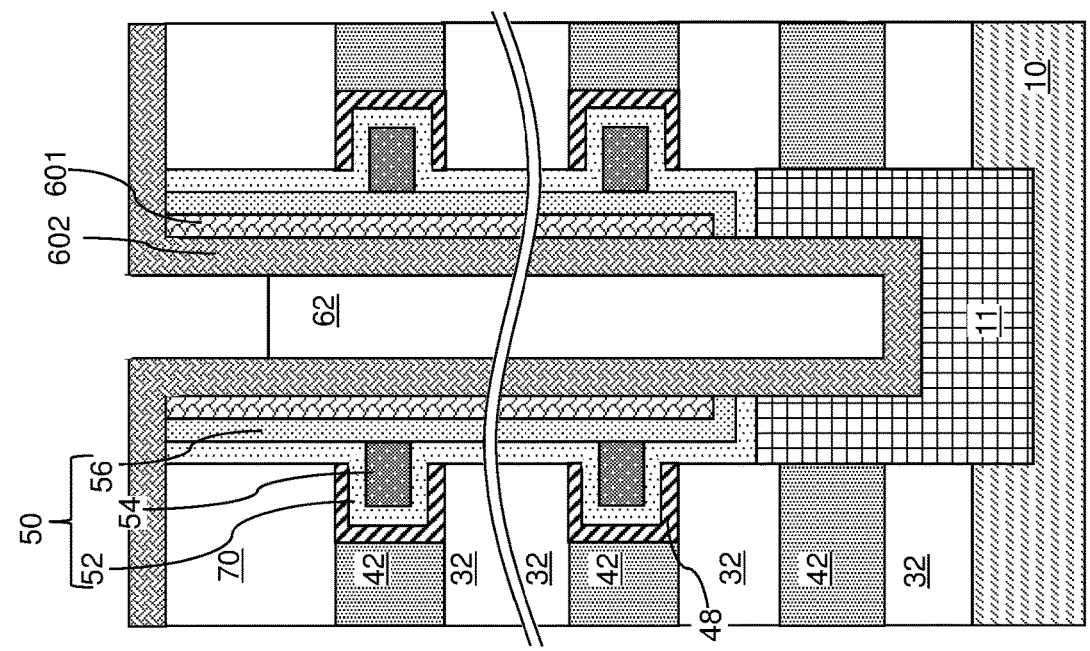

Referring to FIG. 5M, the horizontal portion of the dielectric core layer 62L can be removed, for example, by a recess etch from above the top surface of the second semiconductor channel layer 602. Further, the material of the dielectric core layer 62L can be vertically recessed selective to the semiconductor material of the second semiconductor channel layer 602 into each memory opening 49 down to a depth between a first horizontal plane including the top surface of the insulating cap layer 70 and a second horizontal plane including the bottom surface of the insulating cap layer 70. Each remaining portion of the dielectric core layer 62L constitutes a dielectric core 62.

Referring to FIG. 5N, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration of the doped semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material can be removed from above the top surface of the insulating cap layer 70, for example, by chemical mechanical planarization (CMP) or a recess etch. Each remaining portion of the semiconductor material having a doping of the second conductively type constitutes a drain region 63. The horizontal portion of the second semiconductor channel layer 602 located above the top surface of the insulating cap layer 70 can be concurrently removed by a planarization process. Each remaining portion of the second semiconductor channel layer 602 can be located entirety within a memory opening 49 or entirely within a support opening 19.

Each remaining portion of the doped semiconductor material having a doping of the second conductivity type constitutes a drain region 63. Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a vertical stack of discrete charge storage elements 54, and laterally surrounds a portion of the vertical semiconductor channel 60. Each contiguous set of a tunneling dielectric layer 56, a vertical stack of discrete charge storage elements 54, and a blocking dielectric layer 52 constitutes a memory film 50, which includes a vertical stack of memory elements that can store a respective data bit with a macroscopic retention time. As used herein, a macroscopic retention time refers to a retention time suitable for operation of a memory device as a permanent memory device such as a retention time in excess of 24 hours. In alternative embodiments, a blocking dielectric layer 52 may not be formed in each memory opening 49, and may be subsequently formed in backside recesses that are formed by removal of the sacrificial material layers 42 at a subsequent processing step.

Each combination of a memory film 50 and a vertical semiconductor channel 60 within a memory opening 49 constitutes a memory stack structure 55. The memory stack structure 55 is a combination of a semiconductor channel 60, a tunneling dielectric layer 56, a plurality of memory elements comprising the discrete charge storage elements 54, and a blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure. The vertical stack of discrete charge storage elements 54 is located at levels of sacrificial material layers 42 that are located above the horizontal plane including the top surface of the pedestal channel portion 11. The tunneling dielectric layer 56 contacts the blocking dielectric layer 52, the vertical stack of discrete charge storage elements 54, and the vertical semiconductor channel 60.

Figure 6:
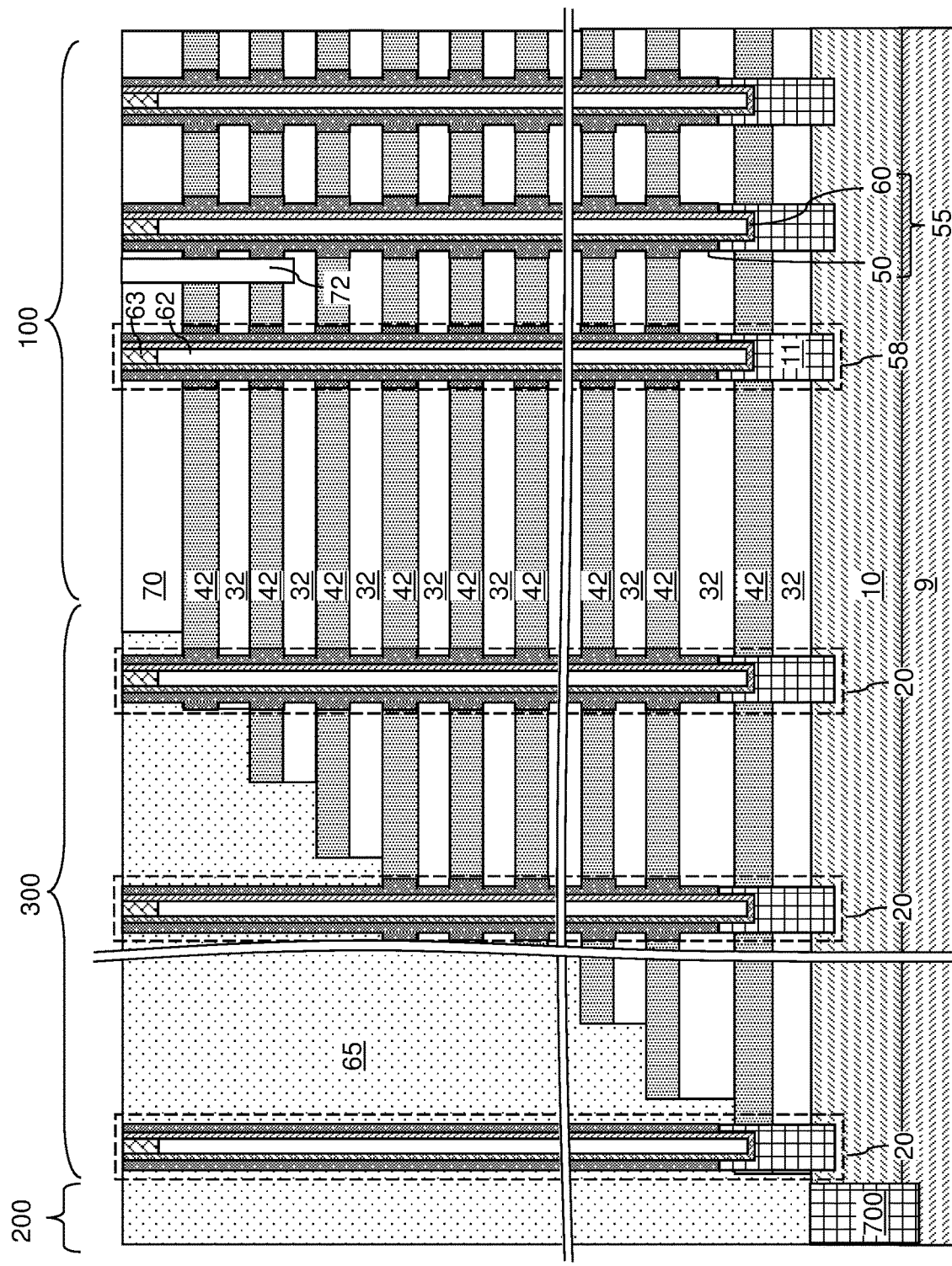
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60, a vertical stack of charge storage regions (comprising a vertical stack of discrete charge storage elements 54) laterally surrounding the tunneling dielectric layer 56, and a blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
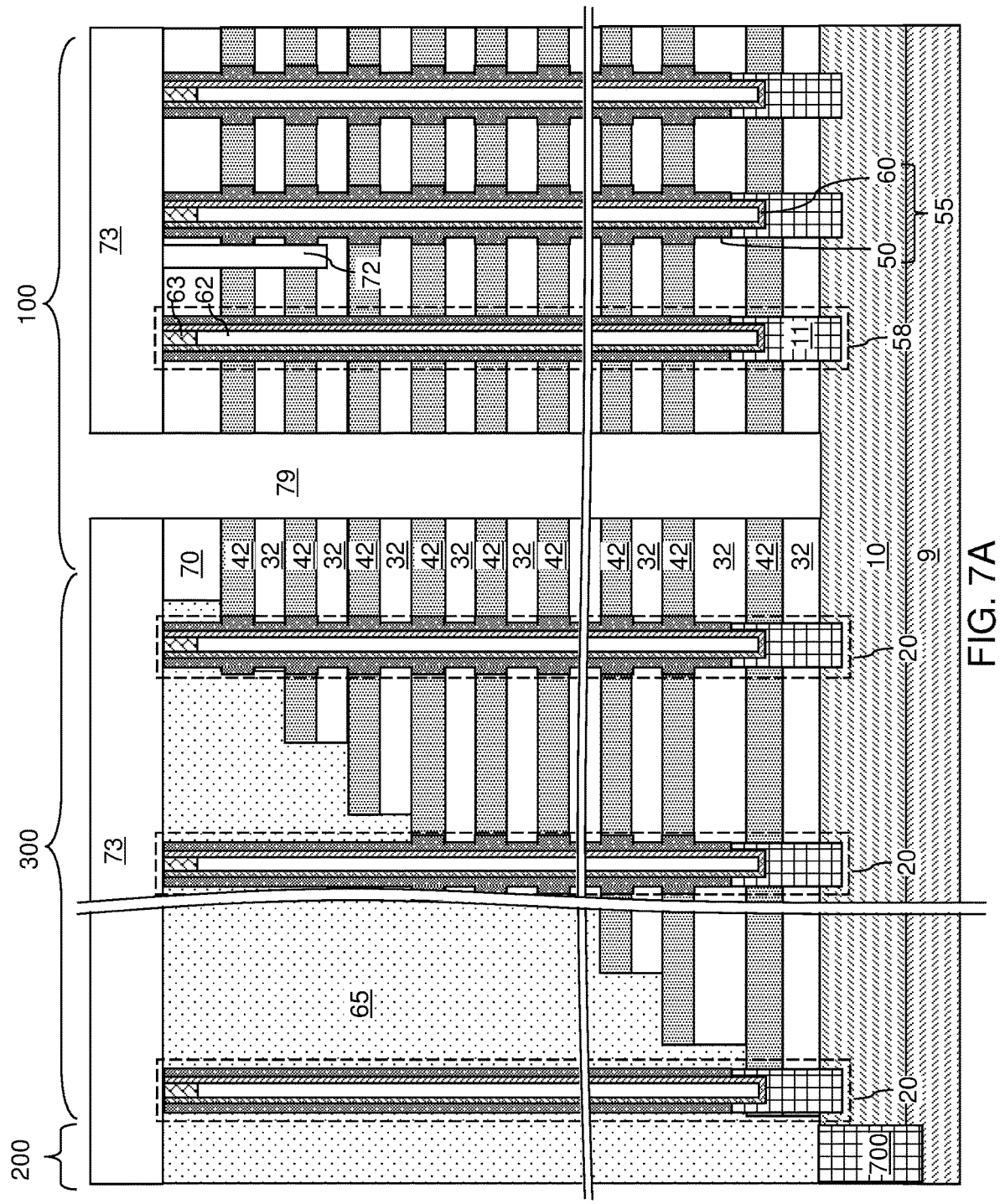
FIG. 7A is a schematic vertical cross-sectional view of the exemplary structure after formation of backside trenches according to an embodiment of the present disclosure.
Figure 7B:
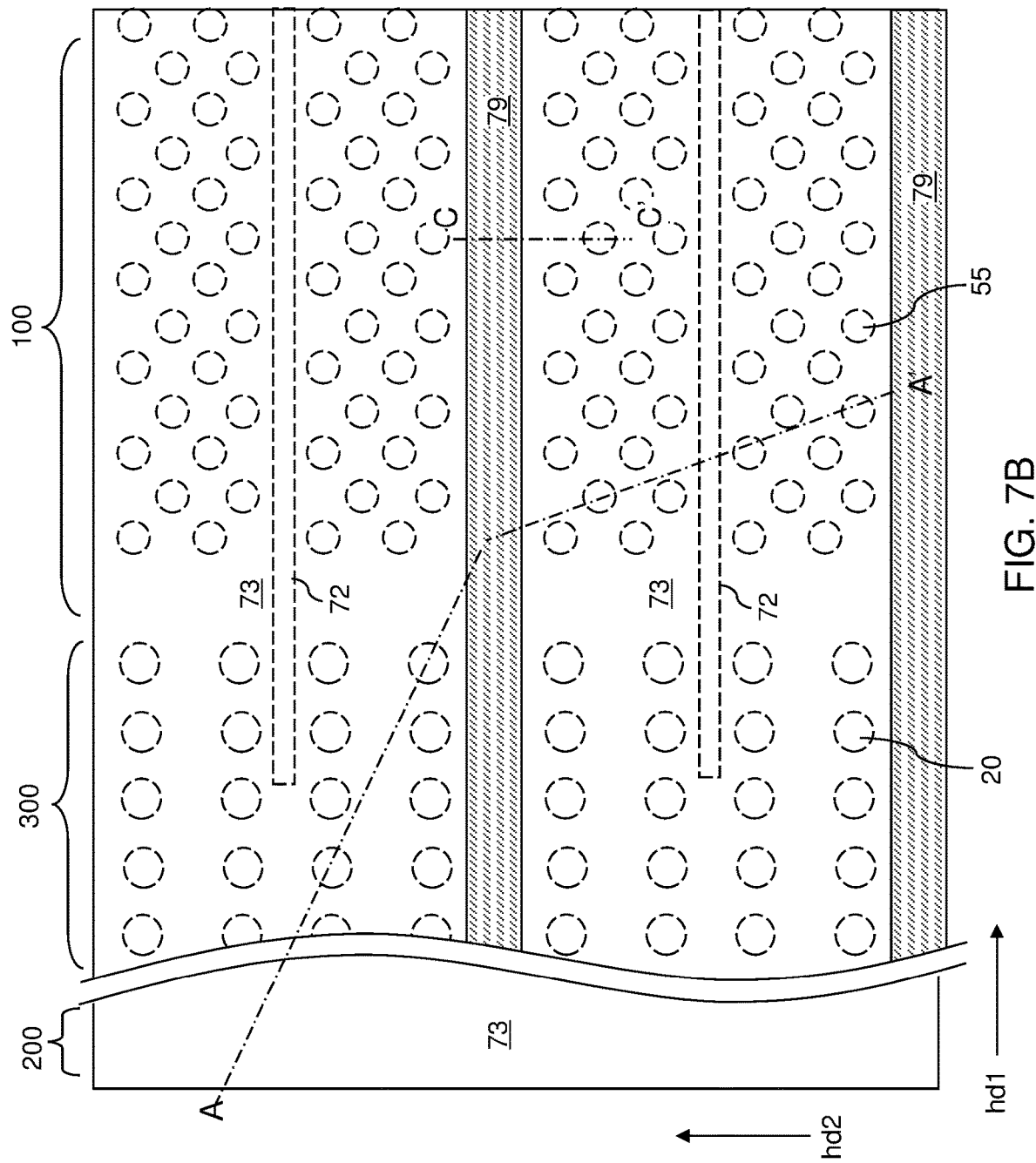
FIG. 7B is a partial see-through top-down view of the exemplary structure of FIG. 7A. The vertical plane A-A' is the plane of the schematic vertical cross-sectional view of FIG. 7A.
Figure 7C:
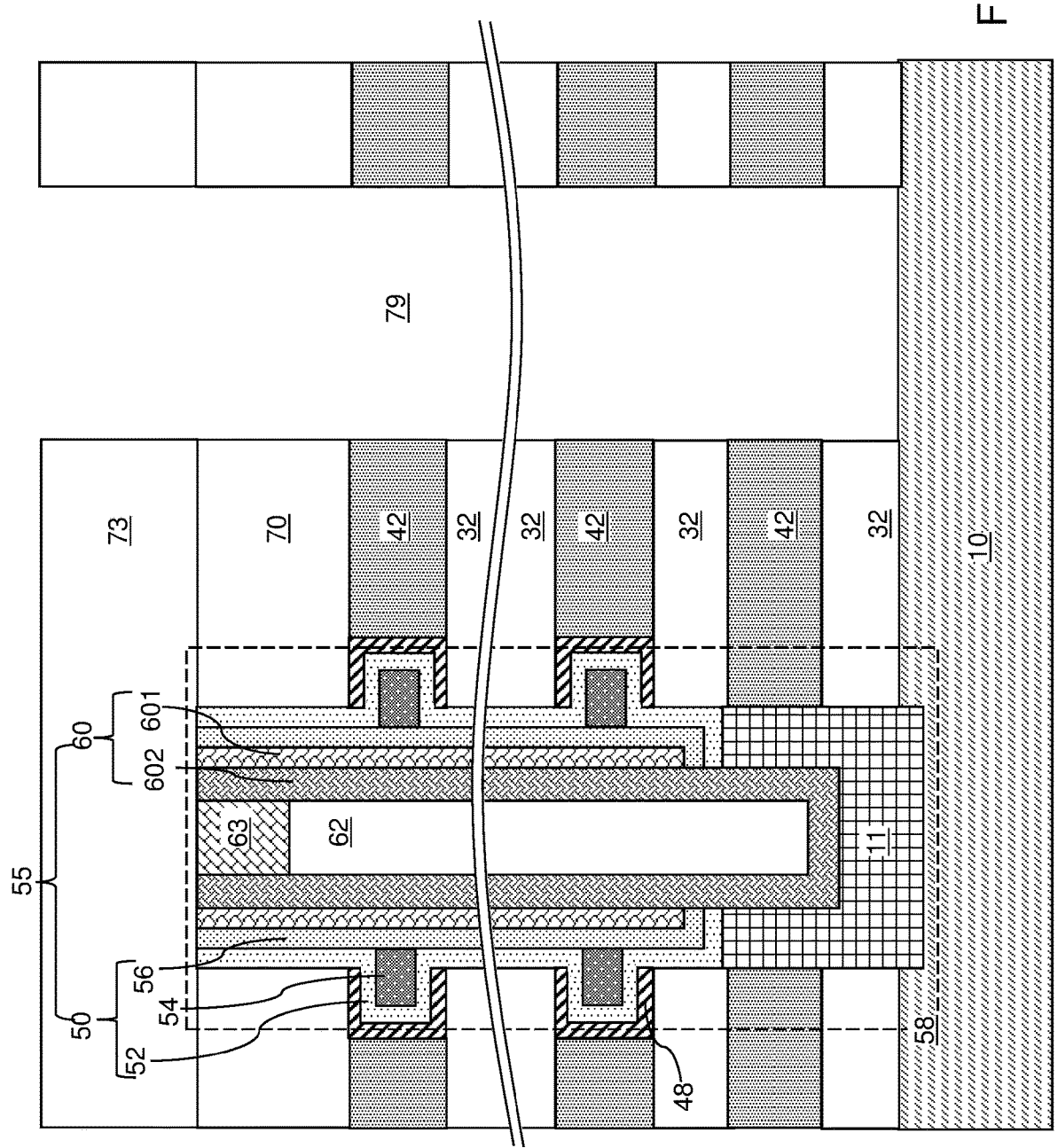
FIG. 7C is a vertical cross-sectional view of the exemplary structure along the vertical plane C-C' of FIG. 7B.

Referring to FIGS. 7A-7C, a contact-level dielectric layer 73 can be formed over the alternating stack (32, 42) of insulating layer 32 and sacrificial material layers 42, and over the memory stack structures 55 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory stack structures 55. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the staircase region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

Figure 8:
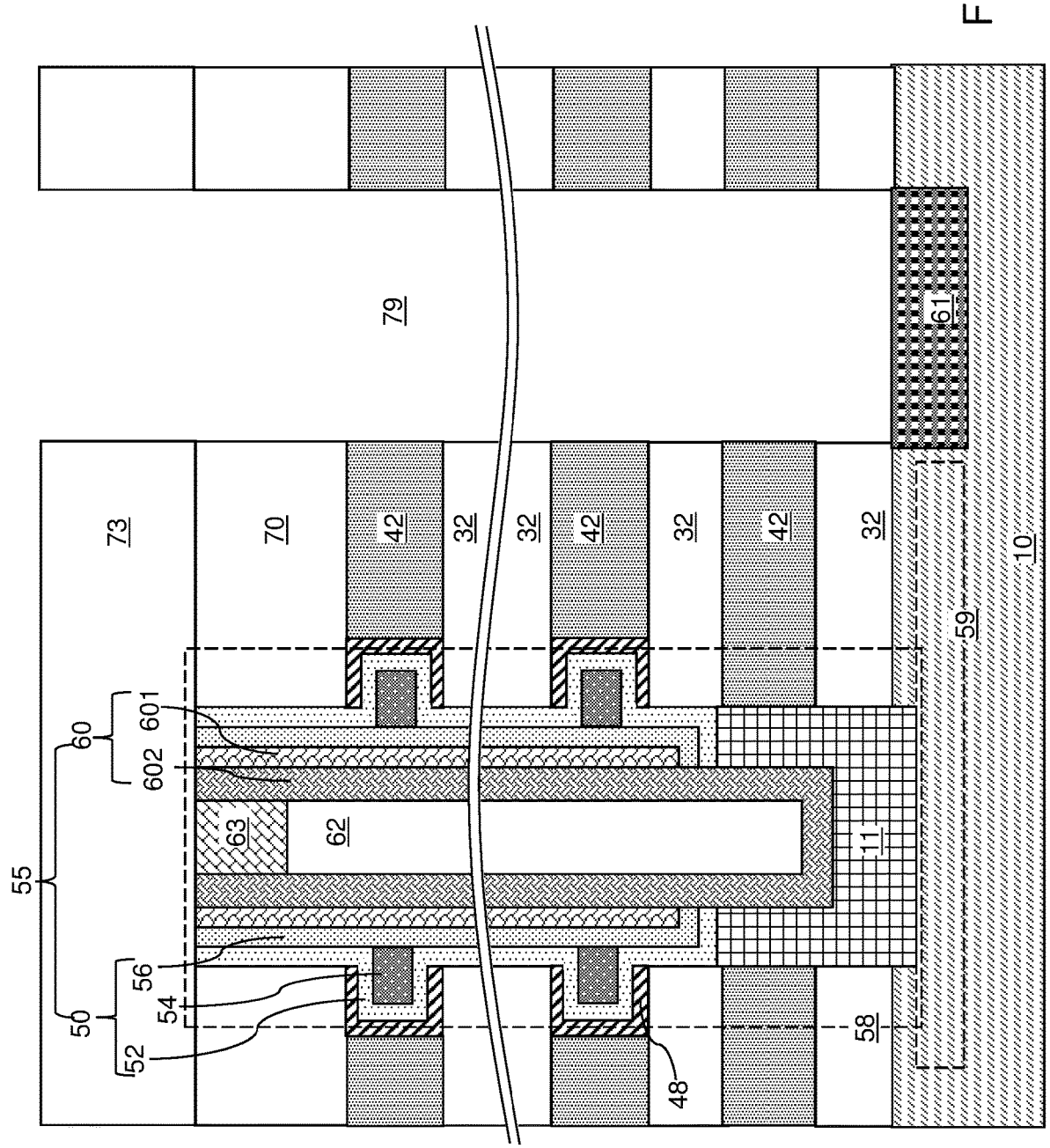
FIG. 8 is a schematic vertical cross-sectional view of a region of the exemplary structure after formation of source regions according to an embodiment of the present disclosure.

Referring to FIG. 8, dopants of the second conductivity type can be implanted into portions of the semiconductor material layer 10 that underlie the backside trenches 79 to form source regions 61. The atomic concentration of the dopants of the second conductivity type in the source regions 61 can be in a range from $5.0 \times 10^{18}/cm^3$ to $2.0 \times 10^{21}/cm^3$, although lesser and greater atomic concentrations can also be employed. Surface portions of the semiconductor material layer 10 that extend between each source region 61 and adjacent memory opening fill structures 58 comprise horizontal semiconductor channels 59.

Figure 9A:
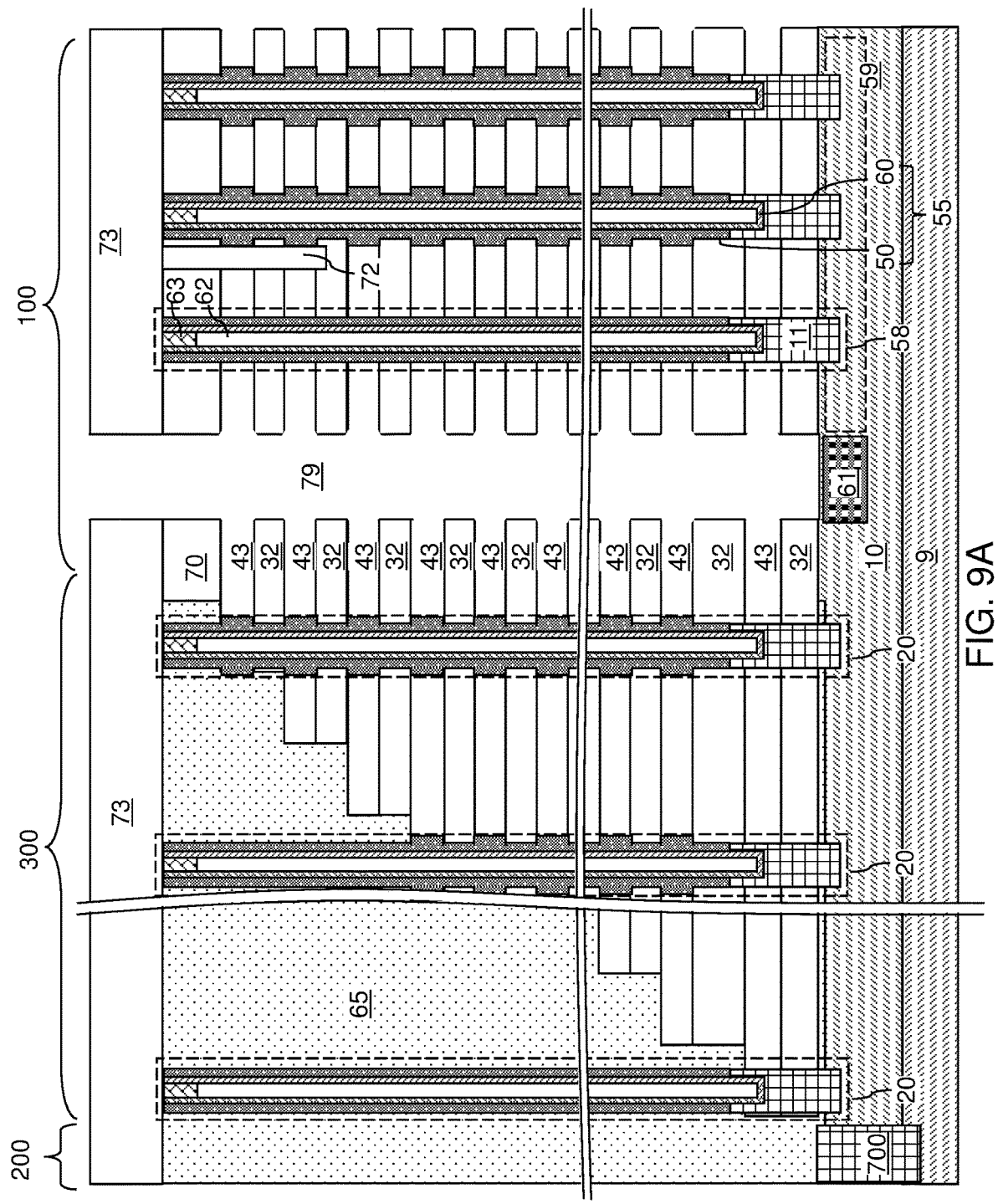
FIG. 9A is a schematic vertical cross-sectional view of the exemplary structure after formation of backside recesses according to an embodiment of the present disclosure.
Figure 9B:
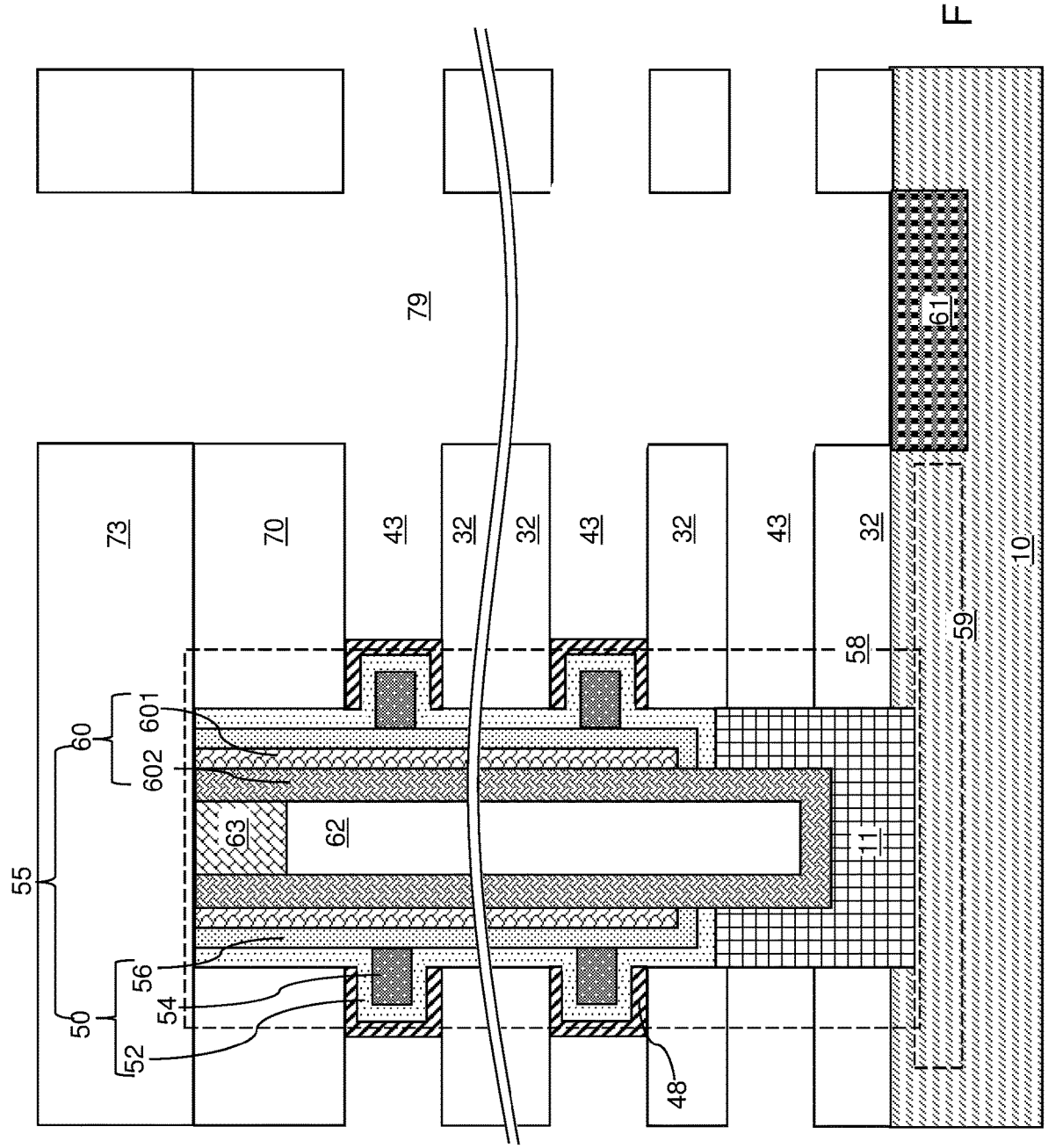
FIG. 9B is a schematic vertical cross-sectional view of a region of the exemplary structure at the processing steps of FIG. 9A.

Referring to FIGS. 9A and 9B, an etchant that selectively etches the second material of the sacrificial material layers 42 with respect to the first material of the insulating layers 32 and selective to the first metallic material of the vertical stacks of inner clam-shaped metallic liners 48 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the first metallic material of the vertical stacks of inner clam-shaped metallic liners 48, and the semiconductor material of the semiconductor material layer 10. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structures 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 10:
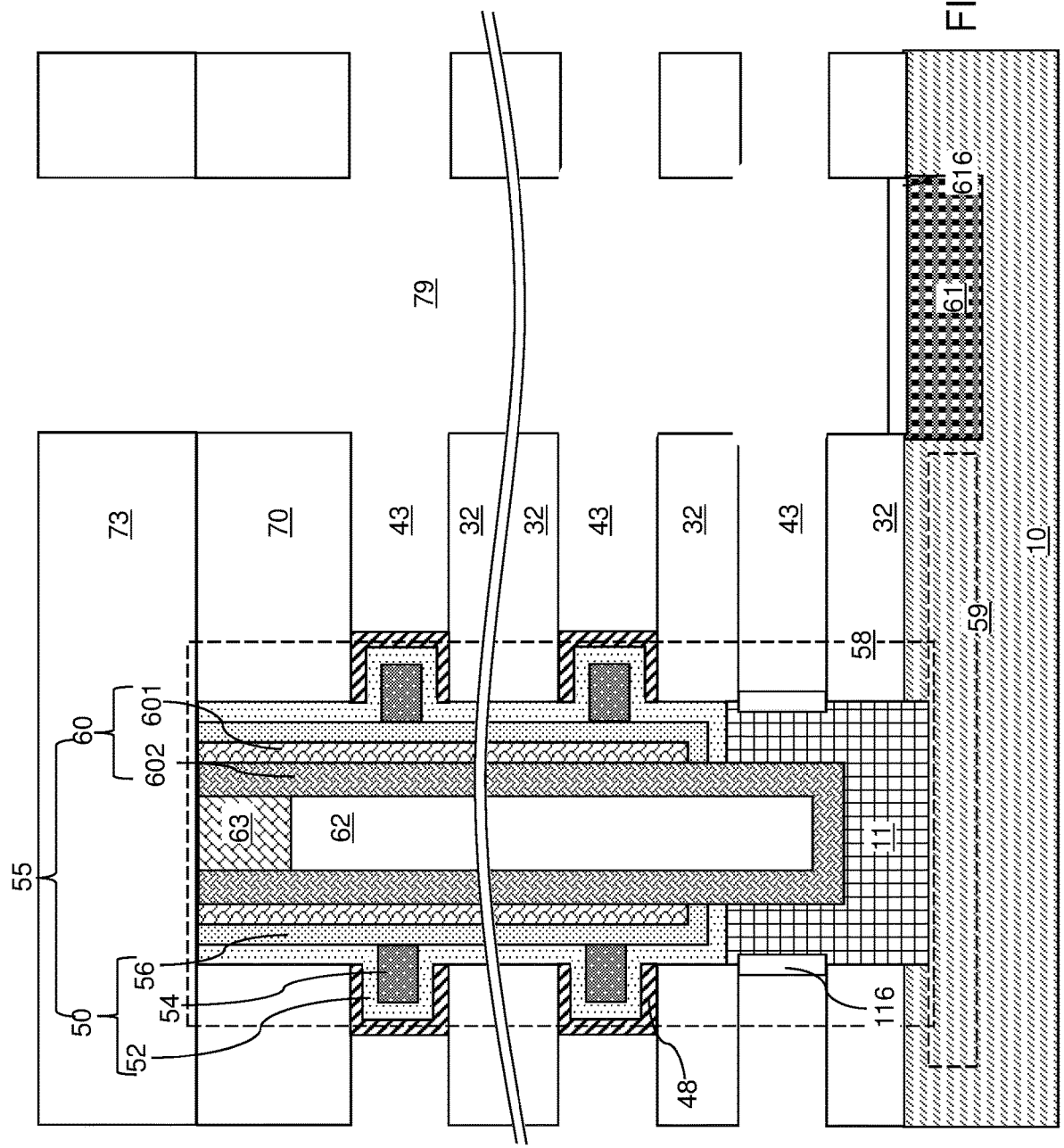
FIG. 10 is a schematic vertical cross-sectional view of a region of the exemplary structure after formation of tubular dielectric spacers and planar dielectric portions according to an embodiment of the present disclosure.

Referring to FIG. 10, physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10. Dopants in the drain regions 63, the source regions 61, and the semiconductor channels 60 can be activated during the anneal process that forms the planar dielectric portions 616 and the tubular dielectric spacers 116. Alternatively, an additional anneal process may be performed to active the electrical dopants in the drain regions 63, the source regions 61, and the semiconductor channels 60.

Figure 11:
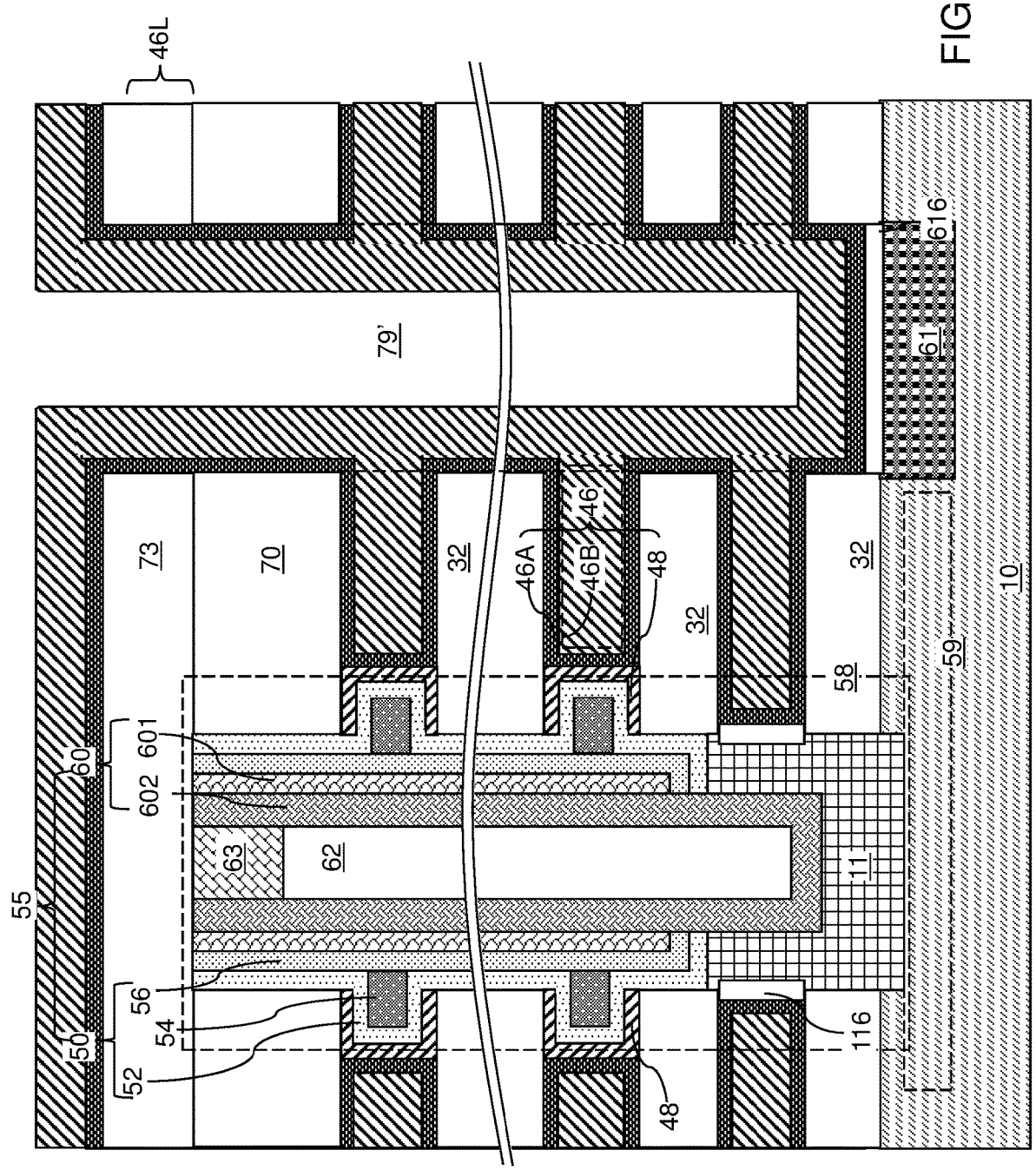
FIG. 11 is a schematic vertical cross-sectional view of a region of the exemplary structure after formation of electrically conductive layers according to an embodiment of the present disclosure.

Referring to FIG. 11, a second metallic material can be conformally deposited on the physically exposed surfaces of the inner clam-shaped metallic liners 48, at the periphery of each backside trench 79, and over the contact-level dielectric layer 73. The second metallic material can be different from the first metallic material. In one embodiment, the second metallic material can comprise, and/or can consist essentially of, a metallic nitride material.

Portions of the deposited second metallic material that are deposited in the backside recesses 43 comprise outer clam-shaped metallic liners 46A. Each outer clam-shaped metallic liner 46A includes an electrically conductive metallic material that can function as a diffusion barrier layer and/or adhesion promotion layer for a metallic fill material to be subsequently deposited. The outer clam-shaped metallic liner 46A can include a conductive metallic nitride material such as TiN, TaN, WN, MoN or a stack thereof. In one embodiment, the outer clam-shaped metallic liner 46A can be deposited by a conformal deposition process such as chemical vapor deposition (CVD) or atomic layer deposition (ALD). The thickness of the outer clam-shaped metallic liner 46A can be in a range from 2 nm to 8 nm, such as from 3 nm to 6 nm, although lesser and greater thicknesses can also be employed. In one embodiment, the outer clam-shaped metallic liner 46A can consist essentially of a conductive metal nitride, such as TiN. A second metallic material layer having a same material composition and a same thickness as the outer clam-shaped metallic liners 46A can be formed at peripheral portions of each backside trench 79 and over the contact-level dielectric layer 73. In an alternative embodiment, the outer clam-shaped metallic liner 46A may be omitted.

A metallic fill material is deposited in the plurality of backside recesses 43, on the sidewalls of the at least one the backside trench 79, and over the top surface of the contact-level dielectric layer 73. Each portion of the deposited metallic fill material that is deposited in a respective backside recess 43 constitutes a metallic fill material portion 46B. In one embodiment, the metallic fill material of the metallic fill material portions 46B may comprise, and/or may consist essentially of, a second elemental metal. The second elemental metal may be different from, or may be the same as, the first elemental metal contained in the vertical stacks of inner clam-shaped metallic liners 48.

The metallic fill material can be deposited by a conformal deposition method, which can be, for example, chemical vapor deposition (CVD), atomic layer deposition (ALD), electroless plating, electroplating, or a combination thereof. In one embodiment, the metallic fill material portion 46B can consist essentially of at least one elemental metal that includes the second elemental metal. The at least one elemental metal of the metallic fill material portion 46B can be selected, for example, from tungsten, molybdenum, cobalt, ruthenium, titanium, or tantalum. If the metallic fill material portion 46B comprises a metal, such as molybdenum, which does not require a diffusion barrier, then the outer clam-shaped metallic liner 46A may be omitted. In one embodiment, the metallic fill material portion 46B can consist essentially of a single elemental metal. In one embodiment, the metallic fill material portion 46B can be deposited employing a fluorine-containing precursor gas such as $WF_6$. In one embodiment, the metallic fill material portion 46B can be a tungsten layer including a residual level of fluorine atoms as impurities. The metallic fill material portion 46B is spaced from the insulating layers 32 and the memory stack structures 55 by the outer clam-shaped metallic liner 46A, which can block diffusion of fluorine atoms therethrough.

The portions of the second metallic material (i.e., the material of the outer clam-shaped metallic liners 46A) and the portions of the deposited metallic fill material that are deposited in the backside trenches 79 and over the contact-level dielectric layer 73 constitute a continuous electrically conductive material layer 46L. A backside cavity 79' is present within each backside trench 79.

Figure 12A:
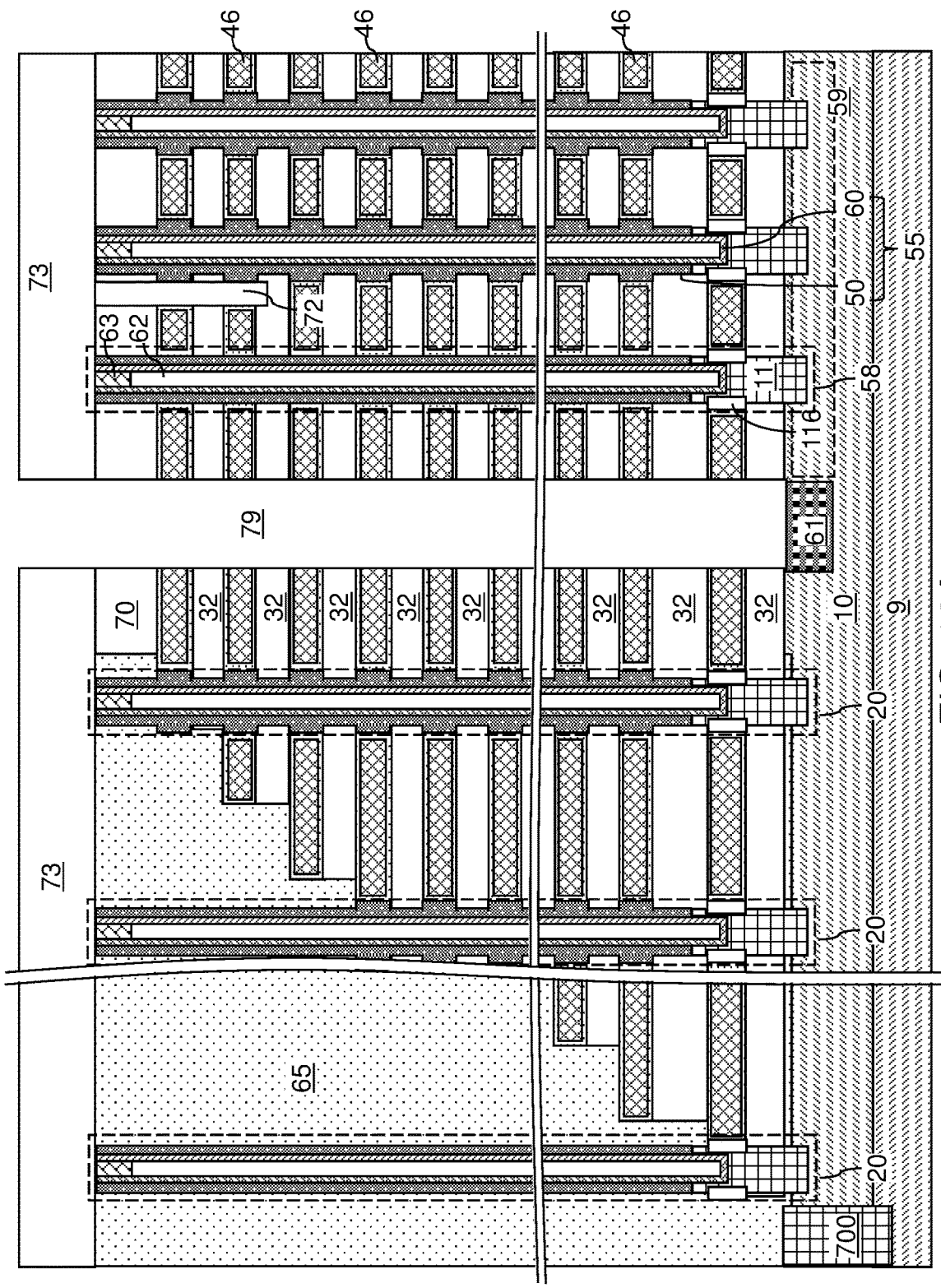
FIG. 12A is a schematic vertical cross-sectional view of the exemplary structure after removal of a deposited conductive material from within the backside trench according to an embodiment of the present disclosure.
Figure 12B:
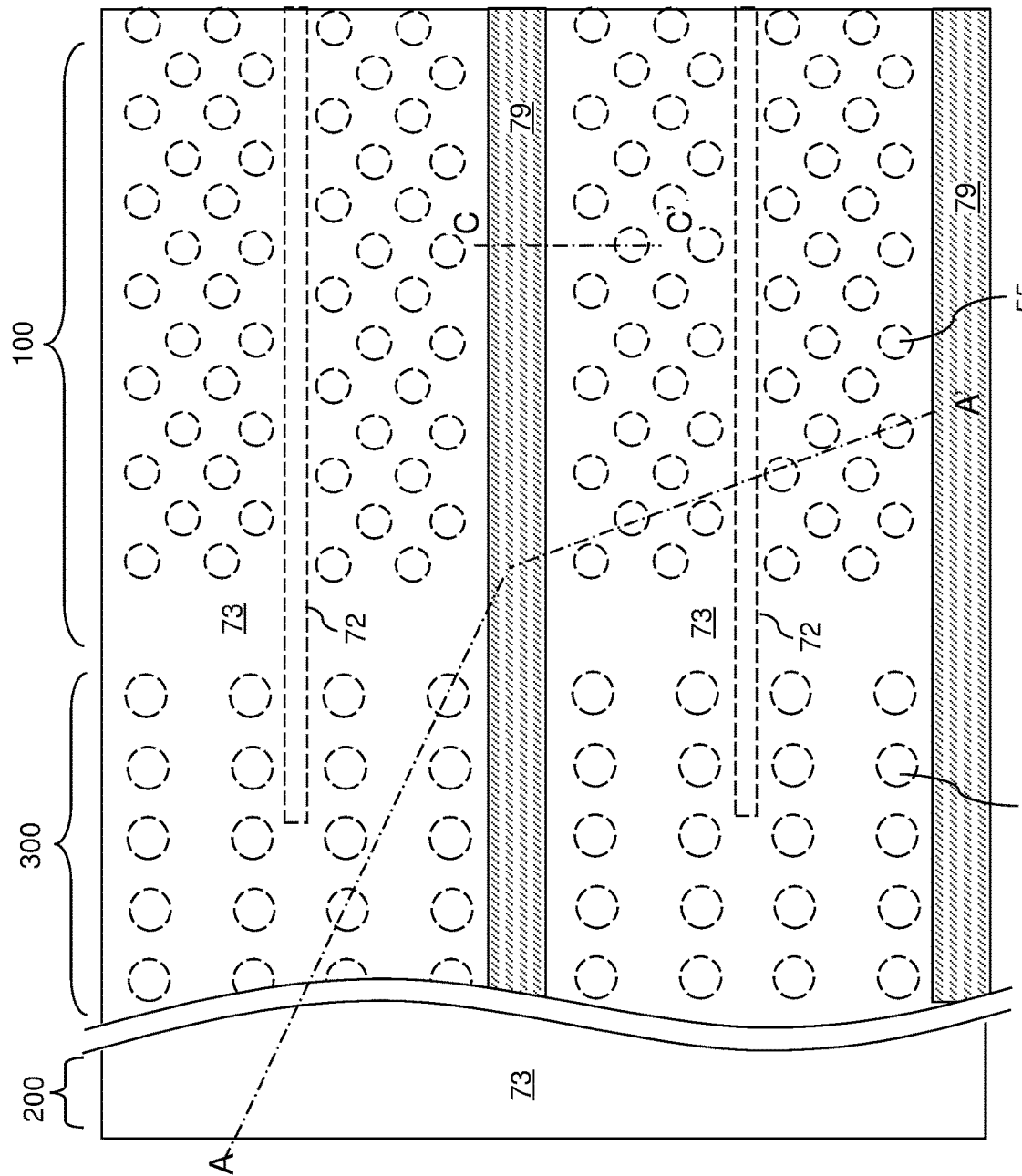
FIG. 12B is a partial see-through top-down view of the exemplary structure of FIG. 12A. The vertical plane A-A' is the plane of the schematic vertical cross-sectional view of FIG. 12A.
Figure 12C:
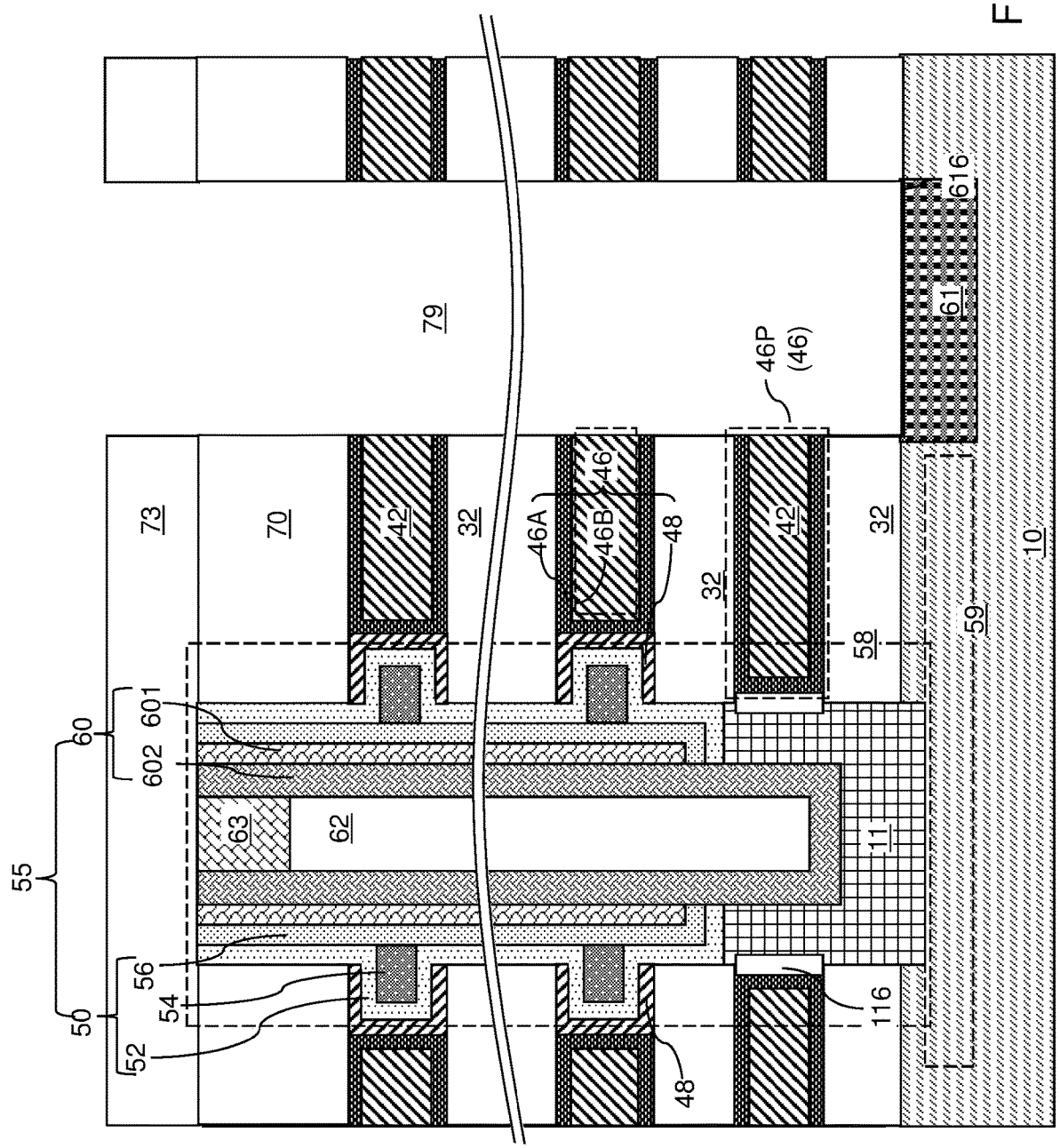
FIG. 12C is a vertical cross-sectional view of the exemplary structure along the vertical plane C-C' of FIG. 12B.

Referring to FIGS. 12A-12C, the deposited metallic material of the continuous electrically conductive material layer 46L is etched back from the sidewalls of each backside trench 79 and from above the contact-level dielectric layer 73, for example, by an isotropic wet etch, an anisotropic dry etch, or a combination thereof. Each contiguous set of metallic material portions including a plurality of inner clam-shaped metallic liners 48, an outer clam-shaped metallic liner 46A, and a metallic fill material portion 46B constitutes an electrically conductive layer 46. The horizontally-extending portions of the outer clam-shaped metallic liner 46A extend from the vertically-extending portion of the outer clam-shaped metallic liner 46A away from the central axis of the memory opening 49. Thus, the horizontally-extending portions of the outer clam-shaped metallic liner 46A extend from their respective vertically-extending portion in an opposite direction from the direction in which the horizontally-extending portions (48U, 48L) of the inner clam-shaped metallic liners 48 extend from their respective vertically-extending portion 48T. A bottommost electrically conductive layer 46P laterally surrounding a plurality of tubular dielectric spacers 116 may also include an outer clam-shaped metallic liner 46A, and a metallic fill material portion 46B. The number of inner clam-shaped metallic liners 48 in an electrically conductive layer 46 may be the same as the total number of memory opening fill structures 58 that the electrically conductive layer 46 laterally surrounds. The number of tubular portions of the outer clam-shaped metallic liner 46A in each electrically conductive layer 46 may be the same as the total number of memory opening fill structures 58 that the electrically conductive layer 46 laterally surrounds. Each electrically conductive layer 46 can be a conductive line structure. Thus, the sacrificial material layers 42 are replaced with the electrically conductive layers 46.

A plurality of electrically conductive layers 46 can be formed in the plurality of backside recesses 43. A tubular dielectric spacer 116 laterally surrounds a pedestal channel portion 11. A bottommost electrically conductive layer 46P laterally surrounds a plurality of tubular dielectric spacer 116 upon formation of the electrically conductive layers 46.

Each electrically conductive layer 46 located above the horizontal plane including the top surfaces of the pedestal channel portions 11 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, the electrically conductive layer 46 can be a word line that functions as a common control gate electrode for the plurality of vertical memory devices. One or more uppermost electrically conductive layers 46 can function as a drain select gate electrode.

In one embodiment, the upper periphery of the outer sidewall of the tubular portion 48T of each inner clam-shaped metallic liner 48 can coincide with an upper periphery of the cylindrical sidewall of a respective outer clam-shaped metallic liner 46A within a same electrically conductive layer 46. The lower periphery of the outer sidewall of the tubular portion 48T of each inner clam-shaped metallic liner 48 can coincide with a lower periphery of the cylindrical sidewall of the respective outer clam-shaped metallic liner 46A. Each inner clam-shaped metallic liner 48 can be in contact with a first portion of the horizontal surface of a respective insulating layer 32, and the respective outer clam-shaped metallic liner 46A can be in contact with a second portion of the horizontal surface of the respective insulating layer 32.

In one embodiment, each electrically conductive layer 46 within a subset of electrically conductive layers 46 located at levels of the vertical stack of discrete charge storage elements 54 comprises a respective inner clam-shaped metallic liner 48 in contact with a respective discrete charge storage element 54, a respective outer clam-shaped metallic liner 46A contacting, and laterally surrounding, the respective inner clam-shaped metallic liner 48, and a respective metallic fill material portion 46B embedded within the respective outer clam-shaped metallic liner 46A. Each of the sacrificial material layers 42 can be replaced with a combination of a respective outer clam-shaped metallic liner 46A and a respective metallic fill material portion 46B embedded within the respective outer clam-shaped metallic liner 46A.

Each contiguous combination of an inner clam-shaped metallic liners 48, an outer clam-shaped metallic liner 46A, and a metallic fill material portion 46B comprises an electrically conductive layer 46.

Figure 13:
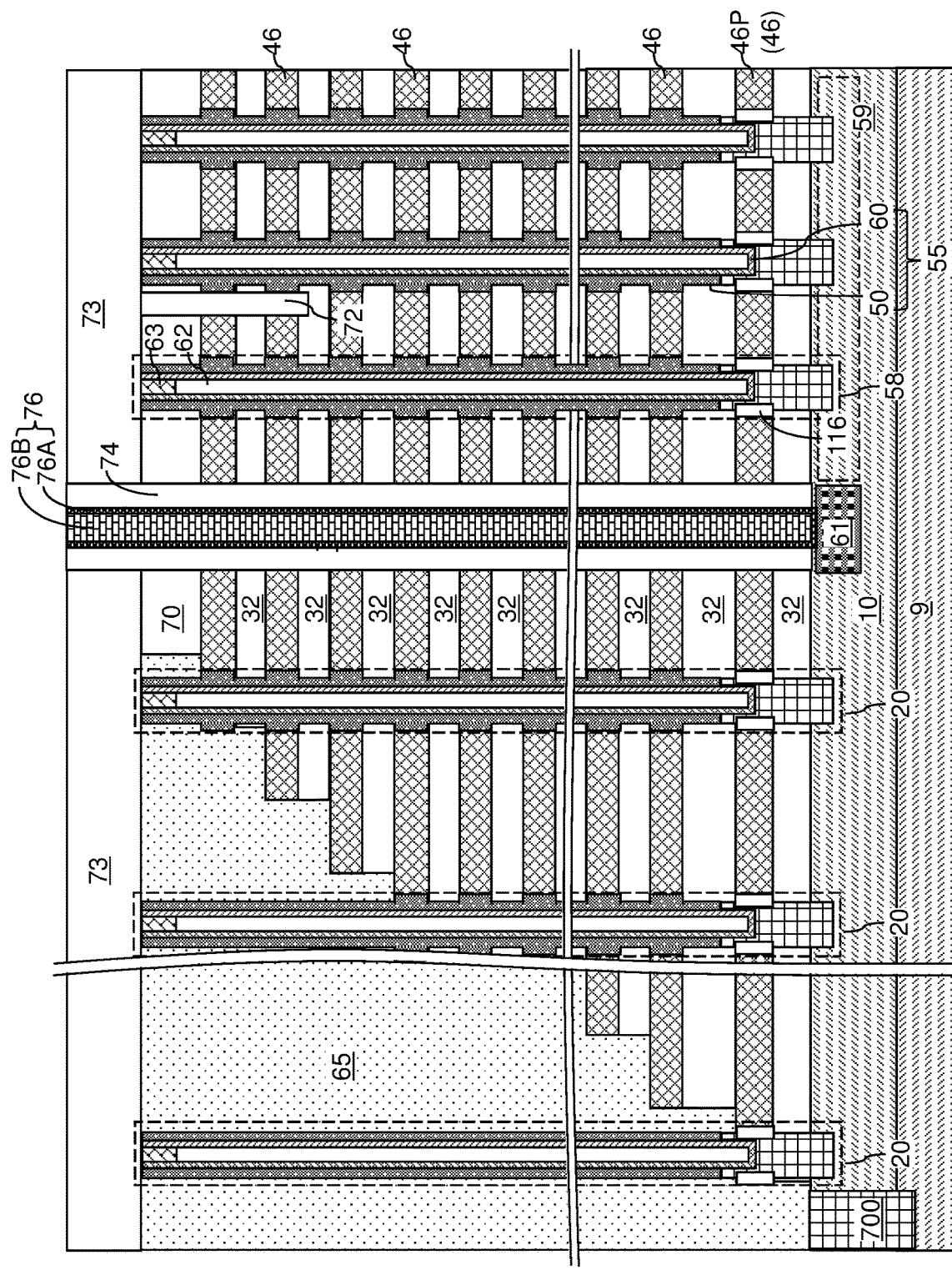
FIG. 13 is a schematic vertical cross-sectional view of the exemplary structure after formation of an insulating spacer and a backside contact structure according to an embodiment of the present disclosure.

Referring to FIG. 13, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46P provided upon formation of the electrically conductive layers 46 within the alternating stack (32, 46) can comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective backside cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, MoN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61.

Figure 14A:
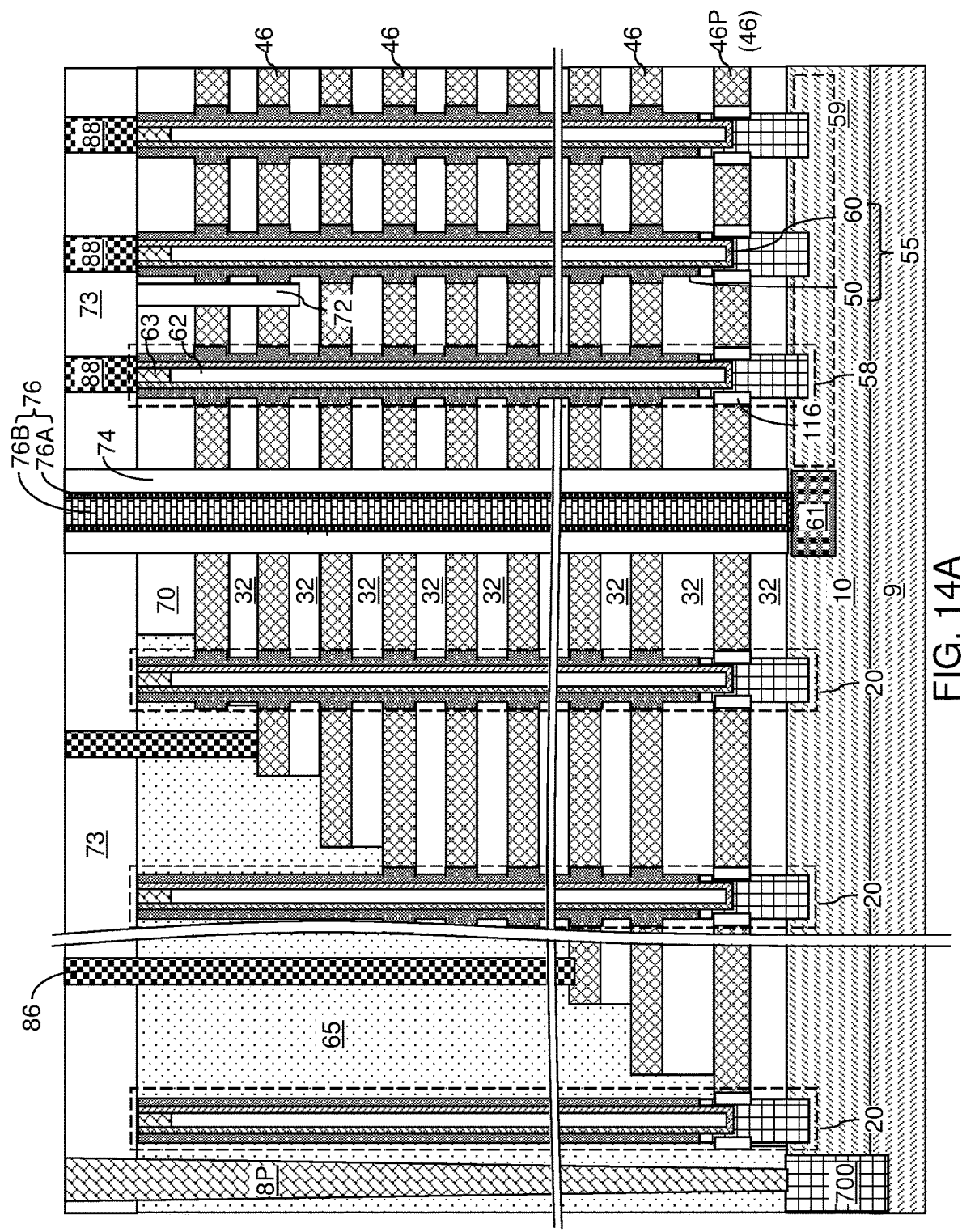
FIG. 14A is a schematic vertical cross-sectional view of the exemplary structure after formation of additional contact via structures according to an embodiment of the present disclosure.
Figure 14B:
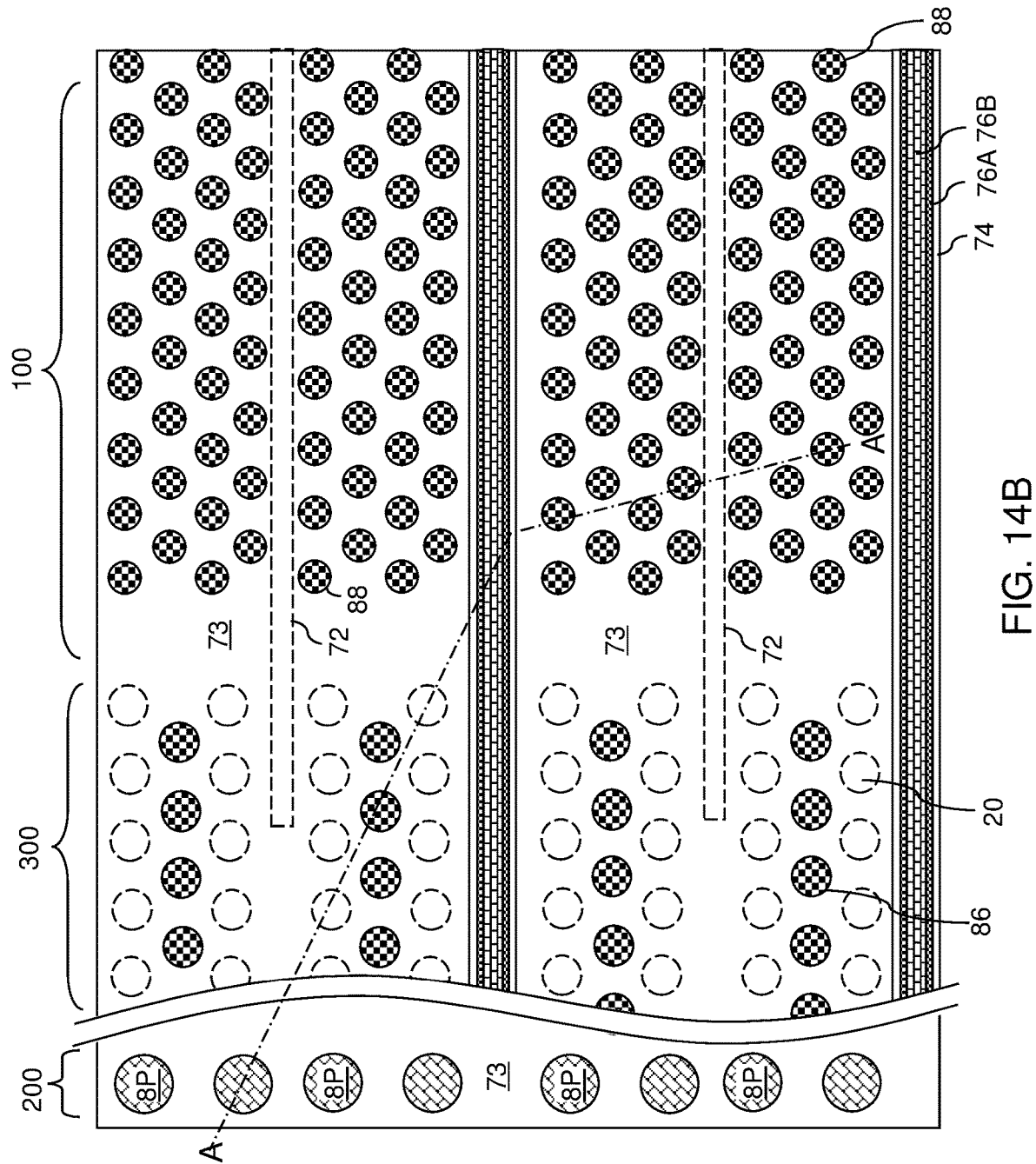
FIG. 14B is a top-down view of the exemplary structure of FIG. 14A. The vertical plane A-A' is the plane of the schematic vertical cross-sectional view of FIG. 14A.

Referring to FIGS. 14A and 14B, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices.

Referring to all drawings and according to various embodiments of the present disclosure, a three-dimensional memory device comprises an alternating stack of insulating layers 32 and electrically conductive layers 46 located over a substrate (9, 10); memory stack structures 55 extending through the alternating stack (32, 46), wherein each of the memory stack structures 55 comprises a blocking dielectric layer 52, a vertical stack of discrete charge storage elements 54 located at levels of the electrically conductive layers 46, a tunneling dielectric layer 56 contacting the blocking dielectric layer 52 and the vertical stack of discrete charge storage elements 54, and a vertical semiconductor channel 60; and inner clam-shaped metallic liners 48 in contact with the respective discrete charge storage elements 46. Each electrically conductive layer 46 within a subset of electrically conductive layers 46 located at levels of the vertical stack of discrete charge storage elements 54 comprises a respective outer clam-shaped metallic liner 46A contacting and laterally surrounding the respective inner clam-shaped metallic liner 48, and a respective metallic fill material portion 46B embedded within the respective outer clam-shaped metallic liner 46B.

In one embodiment, the respective inner clam-shaped metallic liner 48 comprises, and/or consists essentially of, a first metallic material, and the respective outer clam-shaped metallic liner 46A comprises, and/or consists essentially of, a second metallic material that is different from the first metallic material. In one embodiment, the first metallic material comprises an elemental metal selected from tungsten, molybdenum, cobalt, ruthenium, titanium, or tantalum; the outer clam-shaped metallic liner 46A comprises a metallic nitride material; the second metallic material comprises an elemental metal is selected from tungsten, molybdenum, cobalt, ruthenium, titanium, or tantalum; and the blocking dielectric layer 52 comprises a metal oxide material, such as aluminum oxide.

In one embodiment, the respective inner clam-shaped metallic liner 48 comprises, and/or consists of: a tubular portion including an outer sidewall that contacts a cylindrical sidewall of the respective outer clam-shaped metallic liner 46A; an upper annular portion having an outer periphery that is adjoined to an upper periphery of an outer sidewall of the tubular portion; and a lower annular portion having an outer periphery that is adjoined to a lower periphery of the outer sidewall of the tubular portion. In one embodiment, the upper annular portion has an annular bottom surface that contacts an upper annular surface of a laterally protruding portion of the blocking dielectric layer 52; and the lower annular portion has an annular top surface that contacts a lower annular surface of the laterally protruding portion of the blocking dielectric layer 52. In one embodiment, the upper periphery of the outer sidewall of the tubular portion of the respective inner clam-shaped metallic liner 48 coincides with an upper periphery of the cylindrical sidewall of the respective outer clam-shaped metallic liner 46A; and the lower periphery of the outer sidewall of the tubular portion of the respective inner clam-shaped metallic liner 48 coincides with a lower periphery of the cylindrical sidewall of the respective outer clam-shaped metallic liner 46A.

In one embodiment, all surfaces of the vertical stack of discrete charge storage elements 54 are in contact with a respective surface of the blocking dielectric layer 52 or the tunneling dielectric layer 56. In one embodiment, the blocking dielectric layer 52 has a laterally-undulating vertical cross-sectional profile and includes laterally-protruding portions at each level of the vertical stack of discrete charge storage elements 54; and the tunneling dielectric layer 56 has a straight vertical sectional profile and comprises a straight outer sidewall that contacts an inner sidewall of each of the discrete charge storage elements 54.

In one embodiment, the respective inner clam-shaped metallic liner 48 is in contact with a first portion of a horizontal surface of a respective one of the insulating layers 32; the respective outer clam-shaped metallic liner 46A is in contact with a second portion of the horizontal surface of the respective one of the insulating layers 32; and the blocking dielectric layer 52 is in contact with cylindrical surfaces of the insulating layers 32.

In one embodiment, the blocking dielectric layer 52 comprises a layer stack of a dielectric metal oxide blocking dielectric layer 52A and a silicon oxide blocking dielectric layer 52B; and each of the dielectric metal oxide blocking dielectric layer 52A and the silicon oxide blocking dielectric layer 52B continuously vertically extends through each electrically conductive layer 46 within the subset of the electrically conductive layers 46.

The various embodiments of the present disclosure can be employed to provide electrically conductive layers 46 having enhanced coupling with the discrete charge storage elements 54. Specifically, each electrically conductive layer 46 that is coupled with a respective discrete charge storage element 54 contacts an inner clam-shaped metallic liner 48 that includes a tubular portion, an upper horizontally-extending portion, and a lower horizontally-extending portion. Each of the upper horizontally-extending portion and the lower horizontally-extending portion of an inner clam-shaped metallic liner 48 provides additional capacitive coupling with the respective discrete charge storage element 54. Thus, the electrically conductive layers 46 can have capacitive enhanced coupling to a respective discrete charge storage element 54, and can enhance performance of a three-dimensional array of NAND memory devices, by increasing the program and erase speed. Furthermore, in one embodiment, a high capacity, high dielectric constant blocking dielectric layer material, such as a metal oxide material, may be used to complement the enhanced capacitive coupling.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a three-dimensional memory device, comprising:
    forming an alternating stack of insulating layers and sacrificial material layers over a substrate;
    forming a memory opening through the alternating stack;
    forming lateral recesses at levels of the sacrificial material layers around the memory opening;
    forming a vertical stack of discrete clam-shaped semiconductor liners in the lateral recesses;
    replacing the vertical stack of discrete clam-shaped semiconductor liners with a vertical stack of inner clam-shaped metallic liners;
    forming a vertical stack of discrete charge storage elements on the vertical sack of inner clam-shaped metallic liners;
    forming a tunneling dielectric layer and a vertical semiconductor channel over the vertical stack of discrete charge storage elements and the vertical stack of inner clam-shaped metallic liners; and
    replacing each of the sacrificial material layers with an electrically conductive layer.

2. The method of claim 1, wherein:
    each of the lateral recesses comprises a respective void after formation of the vertical stack of inner clam-shaped metallic liners; and
    the vertical stack of the discrete charge storage elements is formed in the voids of the lateral recesses.

3. The method of claim 2, further comprising:
    forming a blocking dielectric layer over the vertical stack of inner clam-shaped metallic liners, such that the voids are present in the lateral recesses after formation of the blocking dielectric layer;
    depositing a charge storage material layer in the memory opening and in the voids in the lateral recesses; and
    etching portions of the charge storage material layer that are located outside the voids, wherein remaining portions of the charge storage material layer comprise the vertical stack of discrete charge storage elements.

4. The method of claim 1, further comprising:
    depositing a semiconductor material layer on surfaces of the lateral recesses and on sidewalls of the insulating layers around the memory opening;
    forming a vertical stack of annular insulating material portions in remaining volumes of the lateral recesses after formation of the semiconductor material layer;
    removing portions of the semiconductor material layer that are not masked by the vertical stack of annular insulating material portions, wherein remaining portions of the semiconductor material layer comprise the vertical stack of discrete clam-shaped semiconductor liners; and
    removing the vertical stack of annular insulating material portions.

5. The method of claim 4, further comprising applying a precursor gas for a metallic material of the inner clam-shaped metallic liners that selectively nucleates on a semiconductor material of the discrete clam-shaped semiconductor liners without nucleating on surfaces of the insulating layers, wherein the precursor gas deposits the metallic material and volatilizes the semiconductor material of the discrete clam-shaped semiconductor liners to form the vertical stack of inner clam-shaped metallic liners.

6. The method of claim 1, wherein the electrically conductive layer comprises a respective outer clam-shaped metallic liner and a respective metallic fill material portion embedded within the respective outer clam-shaped metallic liner.

7. The method of claim 6, further comprising:
forming a backside trench through the alternating stack; and
forming backside recesses by removing the sacrificial material layers selective to the insulating layers and the vertical stack of inner clam-shaped metallic liners, wherein the outer clam-shaped metallic liners and the metallic fill material portions are formed in the backside recesses.

8. The method of claim 1, wherein the blocking dielectric layer comprises a metal oxide layer.

9. The method of claim 8, wherein:
the vertical stack of inner clam-shaped metallic liners comprises a first elemental metal;
the outer clam-shaped metallic liner comprises a metallic nitride material; and
the metallic fill material portion comprises a second elemental metal.

10. The method of claim 9, wherein:
the discrete charge storage elements comprise silicon nitride or conductive floating gates;
the vertical stack of discrete clam-shaped semiconductor liners comprise silicon;
the vertical stack of inner clam-shaped metallic liners comprises tungsten;
the outer clam-shaped metallic liner comprises TiN; and
the metallic fill material portion comprises tungsten.

11. A three-dimensional memory device comprising:
an alternating stack of insulating layers and electrically conductive layers located over a substrate;
memory stack structures extending through the alternating stack, wherein each of the memory stack structures comprises a blocking dielectric layer, a vertical stack of discrete charge storage elements located at levels of the electrically conductive layers, a tunneling dielectric layer contacting the blocking dielectric layer and the vertical stack of discrete charge storage elements, and a vertical semiconductor channel; and
inner clam-shaped metallic liners in contact with the respective discrete charge storage elements
wherein each electrically conductive layer within a subset of electrically conductive layers located at levels of the vertical stack of discrete charge storage elements comprises a respective outer clam-shaped metallic liner contacting and laterally surrounding the respective inner clam-shaped metallic liner, and a respective metallic fill material portion embedded within the respective outer clam-shaped metallic liner.

12. The three-dimensional memory device of claim 11, wherein:
the respective inner clam-shaped metallic liner comprises a first metallic material; and
the respective outer clam-shaped metallic liner comprises a second metallic material that is different from the first metallic material.

13. The three-dimensional memory device of claim 12, wherein:
the first metallic material comprises an elemental metal is selected from tungsten, molybdenum, cobalt, ruthenium, titanium, or tantalum;
the outer clam-shaped metallic liner comprises a metallic nitride material; and
the second metallic material comprises an elemental metal is selected from tungsten, molybdenum, cobalt, ruthenium, titanium, or tantalum; and
the blocking dielectric layer comprises a metal oxide material.

14. The three-dimensional memory device of claim 11, wherein the respective inner clam-shaped metallic liner comprises:
a tubular portion including an outer sidewall that contacts a cylindrical sidewall of the respective outer clam-shaped metallic liner;
an upper annular portion having an outer periphery that is adjoined to an upper periphery of an outer sidewall of the tubular portion; and
a lower annular portion having an outer periphery that is adjoined to a lower periphery of the outer sidewall of the tubular portion.

15. The three-dimensional memory device of claim 14, wherein:
the upper annular portion has an annular bottom surface that contacts an upper annular surface of a laterally protruding portion of the blocking dielectric layer; and
the lower annular portion has an annular top surface that contacts a lower annular surface of the laterally protruding portion of the blocking dielectric layer.

16. The three-dimensional memory device of claim 15, wherein:
the upper periphery of the outer sidewall of the tubular portion of the respective inner clam-shaped metallic liner coincides with an upper periphery of the cylindrical sidewall of the respective outer clam-shaped metallic liner; and
the lower periphery of the outer sidewall of the tubular portion of the respective inner clam-shaped metallic liner coincides with a lower periphery of the cylindrical sidewall of the respective outer clam-shaped metallic liner.

17. The three-dimensional memory device of claim 11, wherein all surfaces of the vertical stack of discrete charge storage elements are in contact with a respective surface of the blocking dielectric layer or the tunneling dielectric layer.

18. The three-dimensional memory device of claim 11, wherein:
the blocking dielectric layer has a laterally-undulating vertical cross-sectional profile and includes laterally-protruding portions at each level of the vertical stack of discrete charge storage elements; and
the tunneling dielectric layer has a straight vertical sectional profile and comprises a straight outer sidewall that contacts an inner sidewall of each of the discrete charge storage elements.

19. The three-dimensional memory device of claim 11, wherein:
the respective inner clam-shaped metallic liner is in contact with a first portion of a horizontal surface of a respective one of the insulating layers;

the respective outer clam-shaped metallic liner is in contact with a second portion of the horizontal surface of the respective one of the insulating layers; and the blocking dielectric layer is in contact with cylindrical surfaces of the insulating layers.

20. The three-dimensional memory device of claim 11, wherein:

the blocking dielectric layer comprises a layer stack of a dielectric metal oxide blocking dielectric layer and a silicon oxide blocking dielectric layer; and each of the dielectric metal oxide blocking dielectric layer and the silicon oxide blocking dielectric layer continuously vertically extends through each electrically conductive layer within the subset of the electrically conductive layers.

* * * * *